United States Patent
Choi et al.

(10) Patent No.: US 9,048,326 B2
(45) Date of Patent: Jun. 2, 2015

(54) THIN FILM TRANSISTOR SUBSTRATE AND METHOD OF MANUFACTURING THE SAME

(71) Applicant: SAMSUNG DISPLAY CO., LTD., Yongin, Gyeonggi-do (KR)

(72) Inventors: Youngjoo Choi, Anyang-si (KR); Gwang-Bum Ko, Seongnam-si (KR); GwonHeon Ryu, Cheonan-si (KR); Joongeol Kim, Seoul (KR); Do-Hyun Kim, Seongnam-si (KR); Sang-Moon Moh, Hwaseong-si (KR); WooGeun Lee, Yongin-si (KR); WonHee Lee, Seoul (KR)

(73) Assignee: SAMSUNG DISPLAY CO., LTD. (KR)

(*) Notice: Subject to any disclaimer, the term of this patent is extended or adjusted under 35 U.S.C. 154(b) by 87 days.

(21) Appl. No.: 13/710,889

(22) Filed: Dec. 11, 2012

(65) Prior Publication Data

US 2013/0228772 A1   Sep. 5, 2013

(30) Foreign Application Priority Data

Mar. 2, 2012 (KR) .................. 10-2012-0021961
Mar. 7, 2012 (KR) .................. 10-2012-0023610

(51) Int. Cl.
  *H01L 21/00* (2006.01)
  *H01L 29/786* (2006.01)
  *H01L 29/66* (2006.01)
  *H01L 27/12* (2006.01)
  *G02F 1/1343* (2006.01)

(52) U.S. Cl.
CPC .... *H01L 29/78693* (2013.01); *H01L 29/66969* (2013.01); *H01L 27/1225* (2013.01); *H01L 27/124* (2013.01); *H01L 27/1259* (2013.01); *H01L 27/1288* (2013.01); *G02F 1/134363* (2013.01)

(58) Field of Classification Search
None
See application file for complete search history.

(56) References Cited

U.S. PATENT DOCUMENTS

| | | | |
|---|---|---|---|
| 7,816,193 | B2 | 10/2010 | Lin |
| 2007/0291217 | A1 | 12/2007 | Kang et al. |
| 2011/0147740 | A1 | 6/2011 | Jeong et al. |
| 2013/0099241 | A1* | 4/2013 | Chun et al. ............ 257/59 |

FOREIGN PATENT DOCUMENTS

| | | | |
|---|---|---|---|
| JP | 2007311541 A | 11/2007 | |
| KR | 100236613 B1 | 10/1999 | |
| KR | 1020040022289 A | 3/2004 | |
| KR | 1020100069432 | * 6/2010 | ......... G02F 1/136 |
| KR | 1020100069432 A | 6/2010 | |

* cited by examiner

*Primary Examiner* — David Vu
*Assistant Examiner* — Cuong Nguyen
(74) *Attorney, Agent, or Firm* — Cantor Colburn LLP

(57) ABSTRACT

A thin film transistor substrate includes a substrate; a gate electrode on the substrate; a semiconductor pattern on the gate electrode; a source electrode on the semiconductor pattern; a drain electrode on the semiconductor pattern and spaced apart from the source electrode; a pixel electrode connected to the drain electrode; and a common electrode partially overlapped with the pixel electrode. The semiconductor pattern is in a same layer of the thin film transistor substrate as the pixel electrode and has an electrical property different from an electrical property of the pixel electrode.

8 Claims, 35 Drawing Sheets

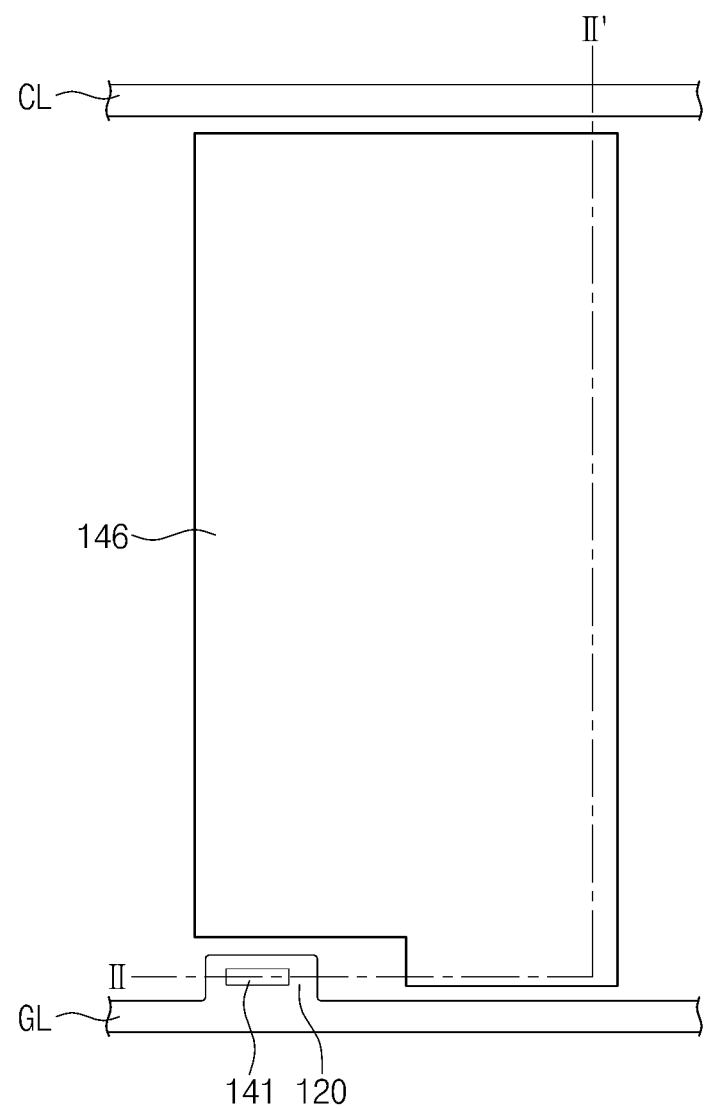

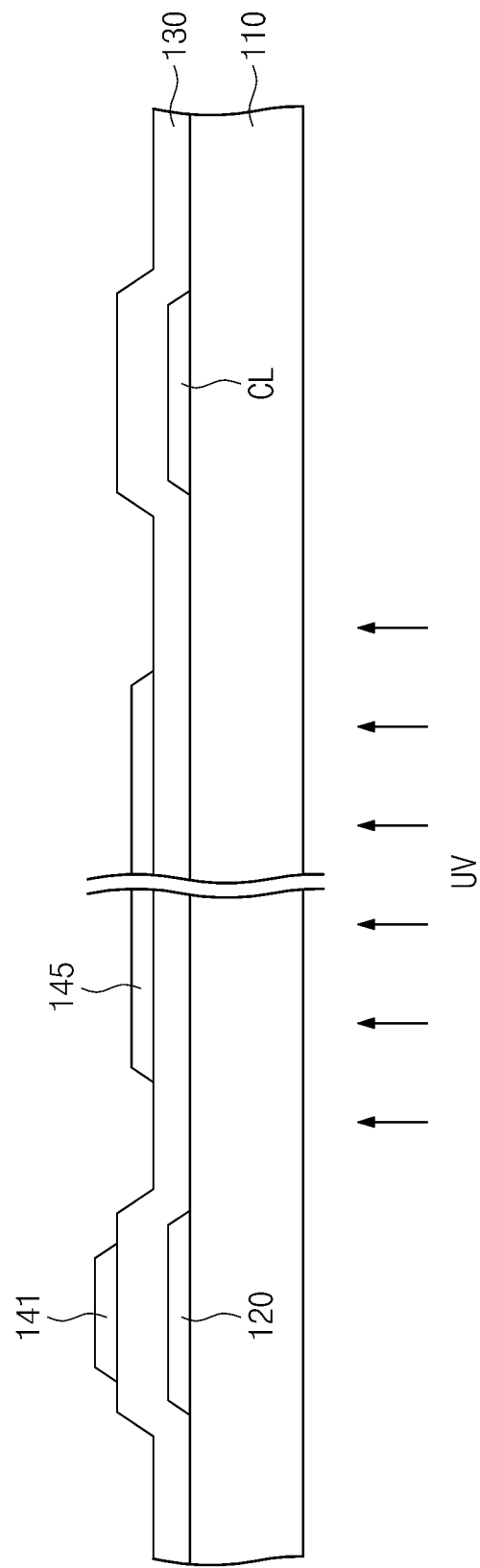

THIN FILM TRANSISTOR SUBSTRATE AND METHOD OF MANUFACTURING THE SAME

This patent application claims priority to Korean Patent Applications Nos. 10-2012-0021961 filed on Mar. 2, 2012 and 10-2012-0023610 filed on Mar. 7, 2012, and all the benefits accruing therefrom under 35 U.S.C. §119, the contents of which are hereby incorporated by reference.

BACKGROUND

1. Field

The disclosure relates to a thin film transistor substrate and a method of manufacturing the same. More particularly, the disclosure relates to a thin film transistor substrate used for a liquid crystal display and a method of manufacturing the thin film transistor substrate.

2. Description of the Related Art

A liquid crystal display is one of flat panel display devices, which is most widely used. The liquid crystal display includes two substrates and a liquid crystal layer disposed between the two substrates. The liquid crystal display applies an electric field to the liquid crystal layer to rearrange liquid crystal molecules of the liquid crystal layer, thereby controlling an amount of light passing through the liquid crystal layer.

The liquid crystal display is classified into a vertical electric field mode liquid crystal display and a horizontal electric filed mode liquid crystal display according to a direction of the electric field.

The liquid crystal display operated in the horizontal electric field mode has been actively developed since the liquid crystal display operated in the vertical electric field mode has problems relating to an optical viewing angle. In detail, research and development have been progressed to reduce a manufacturing cost of a liquid crystal display operated in a plane-to-line switching ("PLS") mode.

In addition, the liquid crystal display includes a thin film transistor in which an active layer includes amorphous silicon or crystalline silicon. However, the amorphous silicon undesirably has low carrier mobility and the crystalline silicon provides difficulty in securing uniform properties. A thin film transistor that includes the active layer including an oxide semiconductor, which has high carrier mobility and uniform properties, has been researched.

SUMMARY

The disclosure provides a thin film transistor substrate capable of reducing a manufacturing cost thereof.

The disclosure provides a method of manufacturing the thin film transistor substrate.

One or more exemplary embodiments provide a thin film transistor substrate including a substrate, a gate electrode disposed on the substrate, a semiconductor pattern disposed on the gate electrode, a source electrode disposed on the semiconductor pattern, a drain electrode disposed on the semiconductor pattern and spaced apart from the source electrode, a pixel electrode connected to the drain electrode, and a common electrode partially overlapped with the pixel electrode.

The semiconductor pattern is disposed in a same layer as the pixel electrode and has an electrical property different from the pixel electrode. The semiconductor pattern and the pixel electrode may include an amorphous indium-gallium-zinc-oxide.

One or more exemplary embodiments provide a method of manufacturing a thin film transistor substrate including forming a gate pattern using a first mask, forming a semiconductor pattern and a pixel electrode using a second mask, forming a source electrode and a drain electrode using a third mask, forming an insulating layer using a fourth mask and forming a common electrode using a fifth mask.

The pixel electrode may be formed by irradiating an ultraviolet ray onto the semiconductor pattern through a rear surface of the substrate using the gate electrode as a mask.

One or more exemplary embodiments provide a thin film transistor substrate including a substrate, a gate electrode disposed on the substrate, a semiconductor pattern disposed on the gate electrode, a source electrode disposed on the semiconductor pattern, a drain electrode disposed on the semiconductor pattern and spaced apart from the source electrode, a pixel electrode connected to the drain electrode, and a common electrode partially overlapped with the pixel electrode. The semiconductor pattern is disposed in a same layer as the common electrode and has an electrical property different from the common electrode.

One or more exemplary embodiments provide a thin film transistor substrate including a substrate, a gate electrode, a semiconductor pattern, an etch stopper, a source electrode, a drain electrode, a common electrode part and a pixel electrode. The etch stopper may contacts a first portion of an upper surface of the semiconductor pattern and is disposed between the source electrode and the drain electrode. The source electrode and drain electrode are disposed on the semiconductor pattern and spaced apart from each other. The pixel electrode is connected to the drain electrode. The common electrode part is partially overlapped with the pixel electrode.

The semiconductor pattern is disposed in the same layer as the common electrode part, and the common electrode part includes more layers than the semiconductor pattern. The common electrode part may include a semiconductor layer, and a conductive layer disposed on the semiconductor layer.

The semiconductor pattern and the semiconductor layer may include the same material, such as amorphous indium-gallium-zinc-oxide.

One or more exemplary embodiment provide a method of manufacturing a thin film transistor substrate including forming a gate pattern using a first mask, forming a semiconductor pattern and a common electrode part using a second mask, forming a first insulating layer including an etch stopper using a third mask, forming a source electrode and a drain electrode using a fourth mask, forming a second insulating layer using a fifth mask and forming a pixel electrode using a sixth mask.

The semiconductor pattern and the common electrode part may bee formed by using a same mask such as a slit mask or a diffraction mask, and an etchant having an etch rate greater for a conductive layer than for a semiconductor thin layer.

One or more exemplary embodiment provide a thin film transistor substrate including a substrate, a gate electrode, a semiconductor pattern, an etch stopper, a source electrode, a drain electrode, a common electrode and a pixel electrode part.

The semiconductor pattern is disposed in the same layer as the pixel electrode part, and the pixel electrode part includes more layers than the semiconductor pattern. The pixel electrode part may include a semiconductor layer, and a conductive layer disposed on the semiconductor layer.

The semiconductor pattern and the semiconductor layer may include the same material, such as amorphous indium-gallium-zinc-oxide.

According to one or more exemplary embodiment detailed above, a manufacturing cost of the thin film transistor substrate may be reduced. In addition, an aperture ratio of pixels may be improved since an undercut does not occur even though the size of the drain electrode is reduced.

In addition, when the etch stopper is formed, damage to the semiconductor pattern may be reduced or effectively prevented, and thus the manufacturing cost of the thin film transistor substrate may be reduced.

Further, the number of the masks required to manufacture the thin film transistor substrate may be reduced. Thus, the manufacturing process of the thin film transistor substrate may be simplified and the manufacturing cost of the thin film transistor substrate may be reduced.

BRIEF DESCRIPTION OF THE DRAWINGS

The above and other features of the invention will become readily apparent by reference to the following detailed description when considered in conjunction with the accompanying drawings wherein:

FIGS. 4A, 5A, 7A, 8A, and 9A are plan views showing an exemplary embodiment of a process of manufacturing the thin film transistor substrate shown in FIGS. 2 and 3;

FIG. 6 shows irradiation of an insulating substrate in the exemplary embodiment of the process of manufacturing the thin film transistor substrate shown in FIGS. 2 and 3;

DETAILED DESCRIPTION

Figure 1:
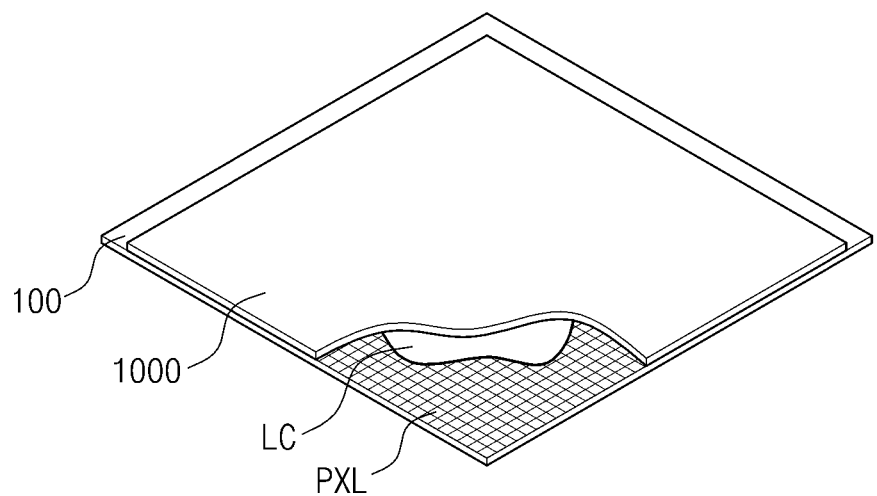
FIG. 1 is a sectional perspective view showing an exemplary embodiment of a display device that includes a thin film transistor substrate according to the invention.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is a sectional perspective view showing an exemplary embodiment of a display device that includes a thin film transistor substrate according to the invention.

Referring to FIG. 1, the display device includes a thin film transistor substrate 100 including a plurality of pixels PXL, an opposite substrate 1000 facing the thin film transistor substrate 100, and a liquid crystal layer LC disposed between the thin film transistor substrate 100 and the opposite substrate 1000.

Each pixel PXL of the thin film transistor substrate 100 includes at least one thin film transistor used to drive liquid crystal molecules, a pixel electrode and a common electrode. The opposite substrate 1000 includes color filters that display colors of images.

The liquid crystal layer LC includes the liquid crystal molecules having an anisotropic dielectric constant. When an electric field is generated between the pixel electrode and the common electrode of the thin film transistor substrate 100, the liquid crystal molecules of the liquid crystal layer LC are rotated in a specific direction between the thin film transistor substrate 100 and the opposite substrate 1000, and thus a transmittance of light incident to the liquid crystal layer LC is controlled.

Figure 2:
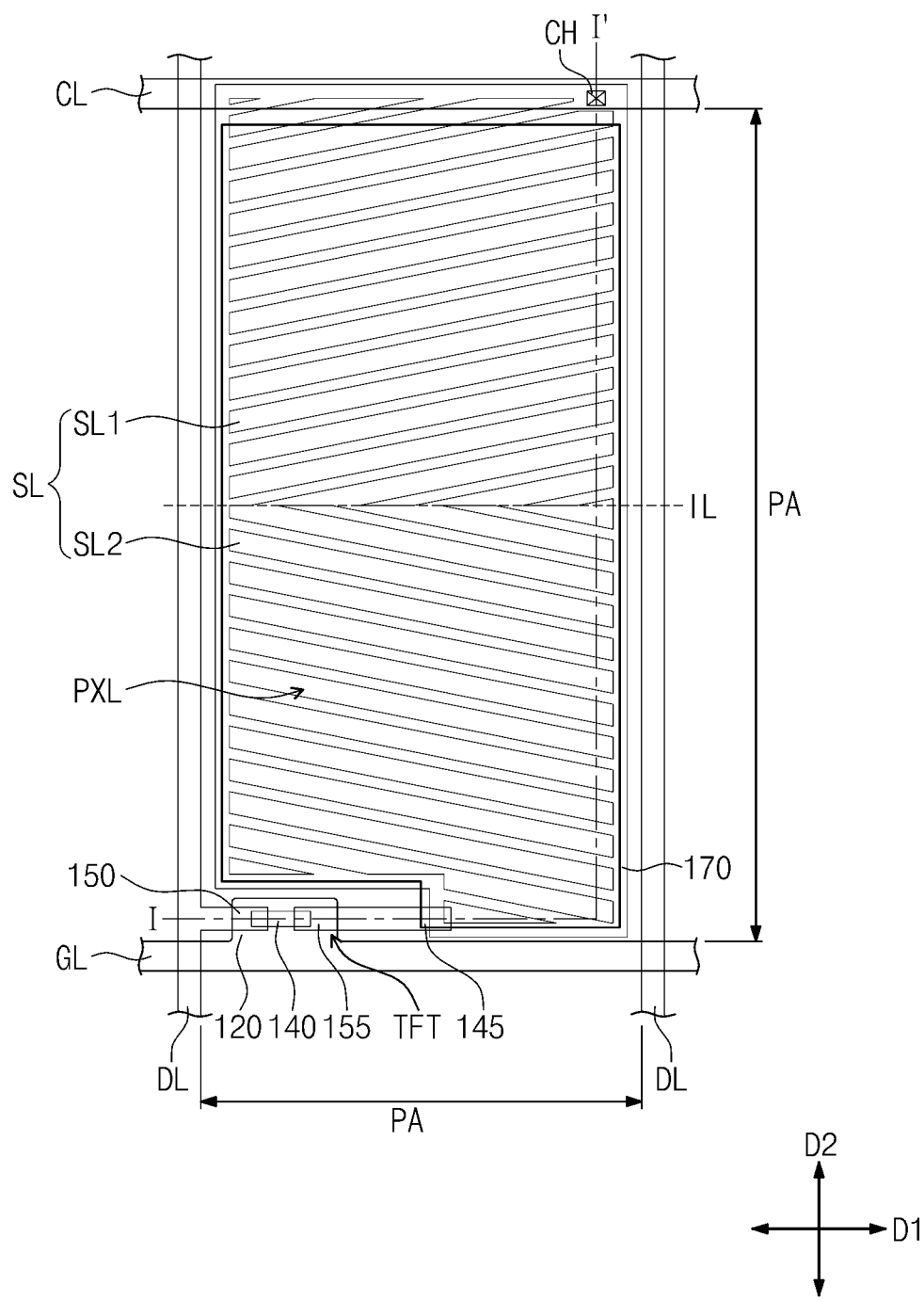
FIG. 2 is a plan view showing an exemplary embodiment of a thin film transistor substrate according to the invention.
Figure 3:
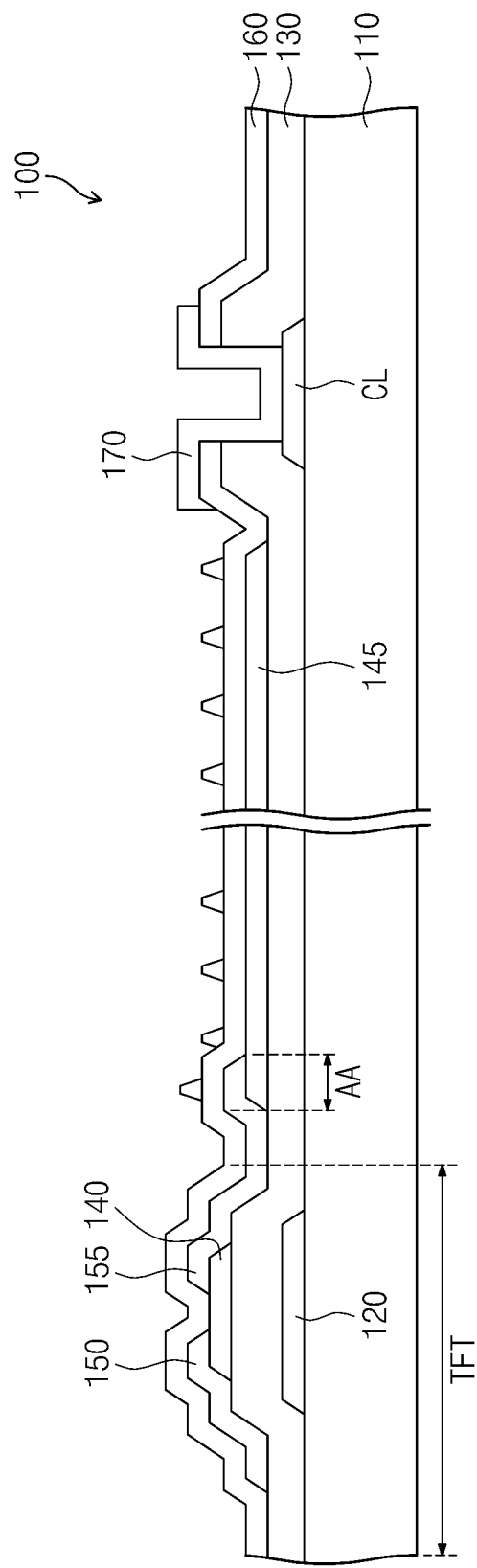
FIG. 3 is a cross-sectional view taken along line I-I' shown in FIG. 2.

FIG. 2 is a plan view showing an exemplary embodiment of a thin film transistor substrate according to the invention and FIG. 3 is a cross-sectional view taken along line I-I' shown in FIG. 2.

Referring to FIGS. 2 and 3, the thin film transistor 100 includes an insulating substrate 110 including a plurality of pixel areas PA, a plurality of gate lines, a plurality of data lines, a plurality of common electrode lines and a plurality of pixels PXL. In the exemplary embodiment, since the pixels PXL have the same structure and function, for the convenience of explanation, one pixel PXL of the pixels, one gate line GL, one common electrode line CL and two data lines DL are shown in FIGS. 2 and 3.

The insulating substrate 110 includes a transparent insulating material. The pixel areas PA are arranged on the insulating substrate 110 in a matrix form.

The gate line GL has a longitudinal axis which is extended in a first direction D1 on the insulating substrate 110. The common electrode line CL has a longitudinal axis which is extended substantially in parallel with the first direction D1 and is spaced apart from the gate line GL in a second direction D2 crossing the first direction D1. The data lines DL have a longitudinal axis which is extended in the second direction D2. The gate line GL and the common electrode line CL may be a same layer of the thin film transistor substrate 100, or may be disposed in or on a same layer of the thin film transistor substrate 100. A gate insulating layer 130 is disposed between the gate line GL and the data lines DL, so that the gate line GL is insulated from the data lines DL by the gate insulating layer 130. Similarly, the gate insulating layer 130 is disposed between the common electrode line CL and the data lines DL, and thus the common electrode line CL is insulated from the data lines DL by the gate insulating layer 130.

The pixel PXL is disposed corresponding to one pixel area PA of the pixel areas. The pixel area PA may have various shapes. In one exemplary embodiment, the pixel area PA is defined by the gate line GL, the data lines DL and the common electrode line CL, but is not limited thereto or thereby.

The pixel PXL includes a thin film transistor TFT, a pixel electrode 145 connected to the thin film transistor TFT, and a common electrode 170.

The thin film transistor TFT includes a gate electrode 120, the gate insulating layer 130, a semiconductor pattern 140, a source electrode 150 and a drain electrode 155.

The gate electrode 120 is protruded from the gate line GL. The gate electrode 120 is disposed on the insulating substrate 110.

The gate insulating layer 130 is disposed on the insulating substrate 110 to cover (e.g., overlap) the gate electrode 120. The gate insulating layer 130 includes an organic insulating material and/or an inorganic insulating material.

The semiconductor pattern 140 is disposed on the gate insulating layer 130. The semiconductor pattern 140 faces the gate electrode 120 while the gate insulating layer 130 is interposed therebetween. In the plan view, the semiconductor pattern 140 is covered by the gate electrode 120. The semiconductor pattern may include an oxide semiconductor, such as amorphous indium-gallium-zinc-oxide ("a-IGZO").

The source electrode 150 and the drain electrode 155 are disposed on the gate insulating layer 130 and the semiconductor pattern 140. The source electrode 150 is branched from the data line DL. When viewed in the plan view, the source electrode 150 is partially overlapped with the semiconductor pattern 140. The drain electrode 155 is spaced apart from the source electrode 150 and partially overlapped with the semiconductor pattern 140.

The pixel electrode 145 and the semiconductor pattern 140 may be a same layer of the thin film transistor substrate 100, or the pixel electrode 145 may be disposed in and/or on a same layer of thin film transistor substrate 100 on which the semiconductor pattern 140 is disposed. That is, the pixel electrode 145 may be disposed on the gate insulating layer 130. The pixel electrode 145 and the semiconductor pattern 140 are spaced apart from each other. The pixel electrode 145 is electrically connected to the drain electrode 155. A portion of the pixel electrode 145 is disposed between a portion of the drain electrode 155 and the gate insulating layer 130.

The pixel electrode 145 may include a same material as the semiconductor pattern 140. That is, the pixel electrode 145 may include the amorphous indium-gallium-zinc-oxide ("a-IGZO").

The pixel electrode 145 has an electrical property different from that of the semiconductor pattern 140. The pixel electrode 145 has conductivity greater than conductivity of the semiconductor pattern 140. The pixel electrode 145 has a conductor property.

The difference of the electrical property between the pixel electrode 145 and the semiconductor pattern 140 is caused by the variation of the electrical property when the amorphous indium-gallium-zinc-oxide ("a-IGZO") is irradiated by light such as by an ultraviolet ray. In detail, when the amorphous indium-gallium-zinc-oxide ("a-IGZO") is irradiated by the ultraviolet ray, a concentration of carrier in the amorphous indium-gallium-zinc-oxide ("a-IGZO") increases and the amorphous indium-gallium-zinc-oxide ("a-IGZO") becomes the conductor after a predetermined time has lapsed. This will be described in detail when an exemplary embodiment of a manufacturing method of the thin film transistor substrate 100 is described.

In addition, since the amorphous indium-gallium-zinc-oxide ("a-IGZO") has transmittance equal to or greater than about 80% with respect to a light having a wavelength in visible light range, the amorphous indium-gallium-zinc-oxide ("a-IGZO") may be used as a transparent electrode.

The thin film transistor substrate 100 further includes an insulating layer 160 disposed on the source electrode 150, the drain electrode 155 and the pixel electrode 145. The insulating layer 160 includes an organic insulating material or an inorganic insulating material. The insulating layer 160 and the gate insulating layer 130 include a contact hole CH extended through thicknesses thereof so as to expose a portion of an upper surface of the common electrode line CL.

The common electrode 170 is disposed on the insulating layer 160. At least a portion of the common electrode 170 is overlapped with the pixel electrode 145 while interposing the insulating layer 160 therebetween. The common electrode 170 is electrically connected to the common electrode line CL through the contact hole CH. The common electrode 170 includes a plurality of slits SL. In FIG. 2, the slits SL include upper slits SL1 and lower slits SL2 divided by an imaginary line IL crossing the pixel area PA along the first direction D1. The imaginary line IL may be centrally disposed in the second direction of the pixel area PA, but is not limited thereto or thereby. A longitudinal axis of the upper slits SL1 are extended from a right upper portion toward a left lower portion of an upper portion of the pixel area PA, and a longitudinal axis of the lower slits SL2 are extended from a right lower portion toward a left upper portion of a lower portion of the pixel area PA, but should not be limited thereto or thereby. In addition, the slits SL are disposed in the common electrode 170 in FIG. 2, but the slits SL may be disposed in one of the pixel electrode 145 and the common electrode 170.

According to the exemplary embodiment of the thin film transistor substrate 100, the semiconductor pattern 140 and the pixel electrode 145 include the same material, e.g., the amorphous indium-gallium-zinc-oxide ("a-IGZO"), but perform different functions. Accordingly, the semiconductor pattern 140 and the pixel electrode 145 may each include the amorphous indium-gallium-zinc-oxide ("a-IGZO"), and thus a manufacturing cost of the thin film transistor substrate 100 may be reduced.

In a conventional thin film transistor substrate, the pixel electrode is disposed on and above the drain electrode in an area at which the drain electrode makes contact with the pixel electrode, so an undercut occurs in a portion of the pixel electrode disposed on an end portion of the drain electrode from a manufacturing process of the conventional thin film transistor substrate. According to the exemplary embodiment of the thin film transistor substrate 100, the drain electrode 155 is disposed on and above the pixel electrode 145 in the area AA in which the drain electrode 155 makes contact with the pixel electrode 145. That is, the exemplary embodiment of the thin film transistor substrate 100 includes the pixel electrode 145 between the drain electrode 155 and the insulating substrate 110. Thus, the undercut of the pixel electrode 145 from a manufacturing process of the thin film transistor substrate 100 may be reduced or effectively prevented.

In addition, in order to solve a contact defect caused by the undercut of the pixel electrode in the conventional thin film transistor substrate, the drain electrode is lengthened to widen the contact area between the drain electrode and the pixel electrode. However, since the undercut does not occur in the exemplary embodiment of the thin film transistor substrate 100, the contact defect does not occur between the drain electrode 155 and the pixel electrode 145 even though the drain electrode 155 has a relatively small size when compared with the drain electrode in the conventional thin film transistor substrate. Consequently, a size of electrodes in the exemplary embodiment of the thin film transistor substrate 100 is reduced, and thus an aperture ratio of the pixel may be improved.

Hereinafter, an exemplary embodiment of a method of manufacturing the thin film transistor substrate shown in FIGS. 2 and 3 will be described in detail.

FIGS. 4A, 5A, 7A, 8A and 9A are plan views showing an exemplary embodiment of a process of manufacturing the thin film transistor substrate shown in FIGS. 2 and 3, FIGS. 4B, 5B, 6, 7B, 8B and 9B are cross-sectional views showing the exemplary embodiment of the process of manufacturing the thin film transistor substrate shown in FIGS. 2 and 3, taken along a line II-II' shown in each of FIGS. 4A, 5A, 7A, 8A and 9A.

Figure 4A:
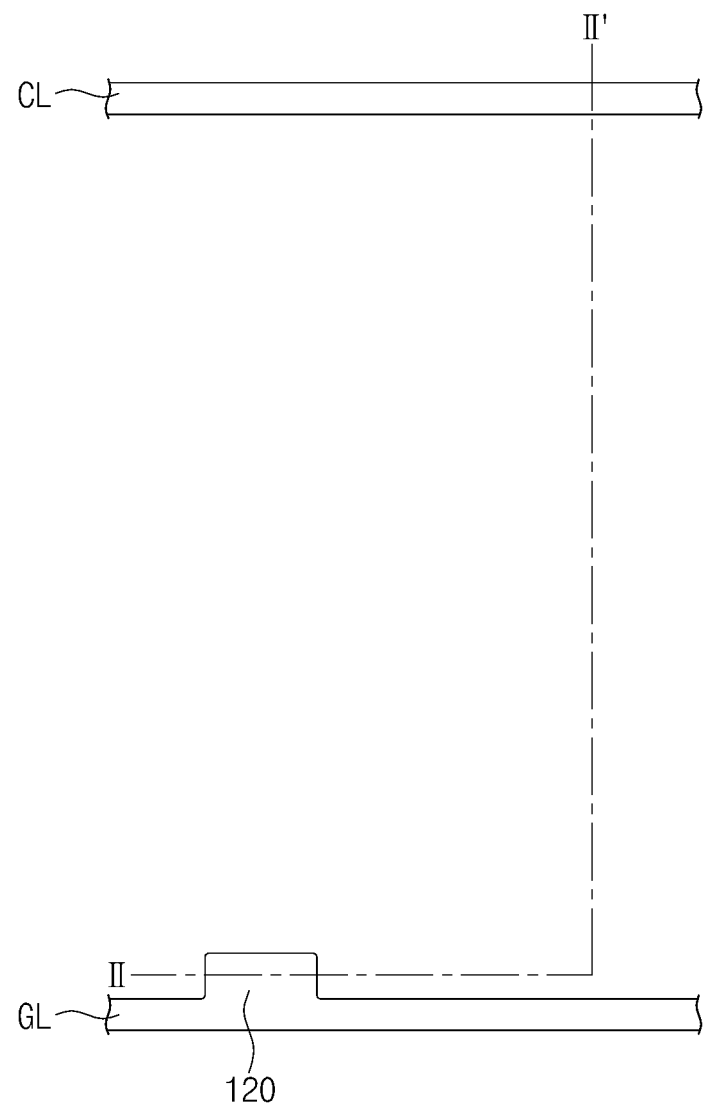
Figure 4B:
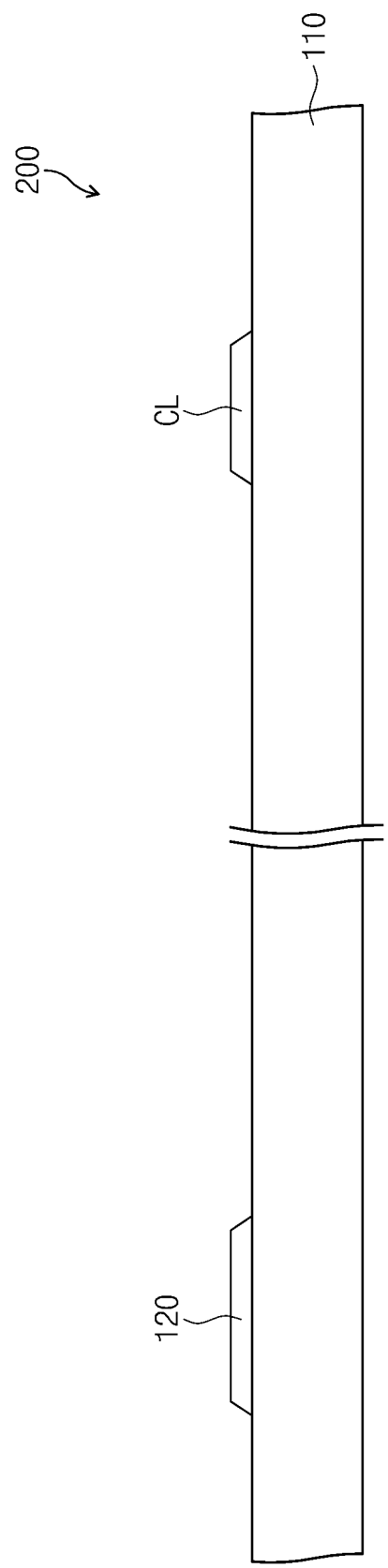
FIGS. 4B, 5B, 7B, 8B, and 9B are cross-sectional views showing the exemplary embodiment of the process of manufacturing the thin film transistor substrate shown in FIGS. 2 and 3, taken along line II-II' shown in each of FIGS. 4A, 5A, 7A, 8A, and 9A.

Referring to FIGS. 4A and 4B, a gate line pattern is formed on the insulating substrate 110, which includes the transparent insulating material, using a first conductive material. The gate line pattern includes the gate electrode 120, the gate line GL and the common electrode line CL. The gate line pattern is formed by depositing the first conductive material over the insulating substrate 110 to form a first conductive layer (not shown) and patterning the first conductive layer through a photolithography process using a first mask (not shown).

Here, the first conductive material may include a metal material, such as copper (Cu), molybdenum (Mo), aluminum (Al), tungsten (W), chromium (Cr), etc. The first conductive layer may have a single-layer structure, a multi-layer structure or an alloy-layer structure by using the first conductive material. In one exemplary embodiment, for instance, the first conductive layer has a multi-layer structure of molybdenum-aluminum-molybdenum (Mo—Al—Mo) or a molybdenum-aluminum (Mo—Al) alloy layer.

A process of forming the semiconductor pattern 140 and the pixel electrode 145 using one mask will be described in detail with reference to FIGS. 5A, 5B and 6.

Figure 5B:
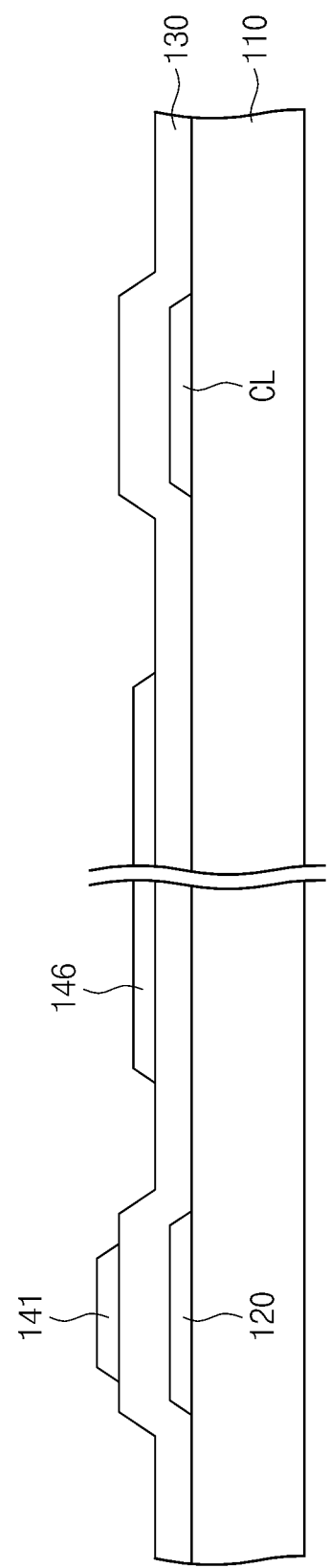

Referring to FIGS. 5A and 5B, the gate insulating layer 130 is formed over the insulating substrate 110 including the gate electrode 120, the gate line GL and the common electrode line CL. The gate insulating layer 130 covers the gate electrode 120, the gate line GL and the common electrode line CL. The gate electrode 120, the gate line GL, and the common electrode line CL are insulated from other conductive layers by the gate insulating layer 130.

A semiconductor thin layer (not shown) is deposited on the entire surface of the insulating substrate 110 including the gate insulating layer 130. The semiconductor thin layer may include the amorphous indium-gallium-zinc-oxide ("a-IGZO"). The semiconductor thin layer (not shown) is patterned by a photolithography process using a second mask (not shown) to form a first semiconductor pattern 141 and a second semiconductor pattern 146. The first semiconductor pattern 141 is covered by the gate electrode 120 when viewed in the plan view, and the first semiconductor pattern 141 and the second semiconductor pattern 146 are spaced apart from each other.

Referring to FIG. 6, light such as an ultraviolet ray UV is irradiated onto a rear surface of the insulating substrate 110 using the gate electrode 120 as a mask to form the pixel electrode 145. The ultraviolet ray UV passes through the insulating substrate 110 and the gate insulating layer 130 to reach the second semiconductor pattern 146, but does not pass through the gate electrode 120. Accordingly, the ultraviolet ray UV does not reach the first semiconductor pattern 141. That is, only the second semiconductor pattern 146 of the first and second semiconductor patterns 141 and 146 is exposed to the ultraviolet ray UV.

The ultraviolet ray UV is irradiated to the second semiconductor pattern 146 to optically dope the second semiconductor pattern 146. Where the second semiconductor pattern 146 is formed of the amorphous indium-gallium-zinc-oxide ("a-IGZO"), a carrier concentration and a binding energy are increased as the exposure time of the second semiconductor pattern 146 to the ultraviolet ray UV becomes longer. Then, the semiconductor property of the second semiconductor pattern 146 is degenerated after a predetermined time has lapsed, and the second semiconductor pattern 146 takes on the conductor property. This material property change is a phenomenon occurring when the Fermi level exceeds the conduction band.

The ultraviolet ray UV may be irradiated to the second semiconductor pattern 146 until the second semiconductor pattern 146 has the conductor property. In one exemplary embodiment, for example, where the ultraviolet ray UV having a wavelength equal to or greater than about 185 nanometers (nm) and equal to or smaller than about 254 nm, and about 25 milliwatts (mW) are used, a time equal to or greater than about 120 minutes (min) is required until the second semiconductor pattern 146 has the conductor property.

The second semiconductor pattern 146 that has the conductor property may define the pixel electrode 145 of the thin film transistor substrate 100.

Figure 7A:
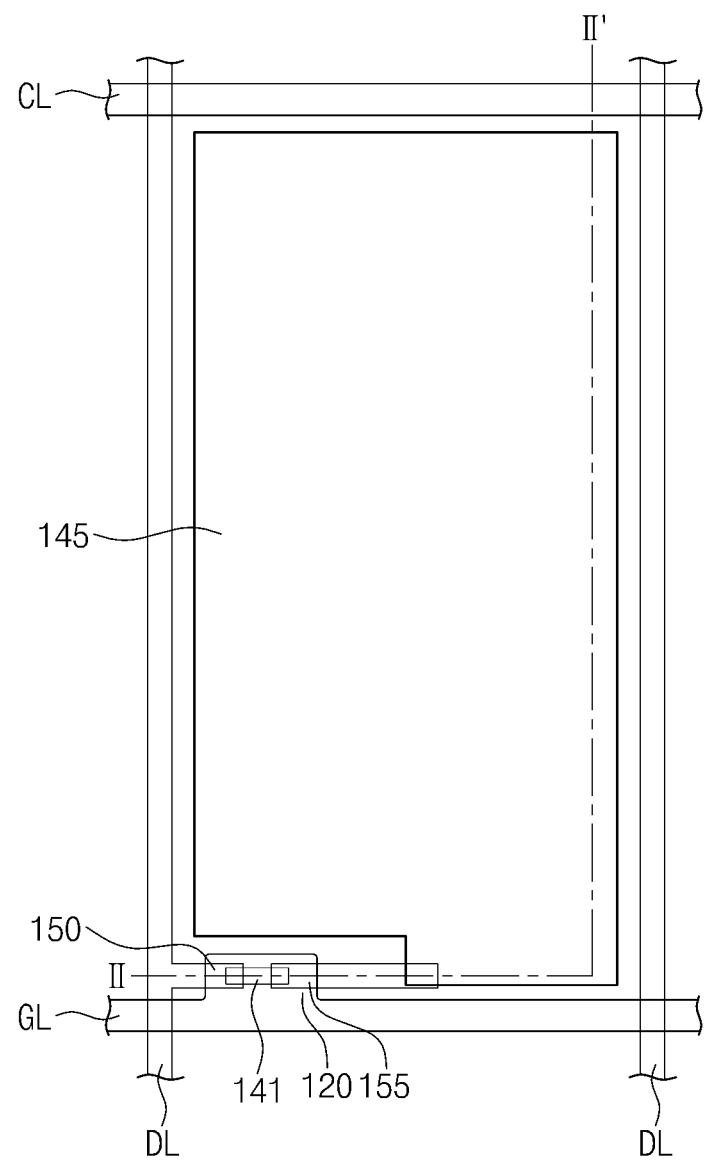
Figure 7B:
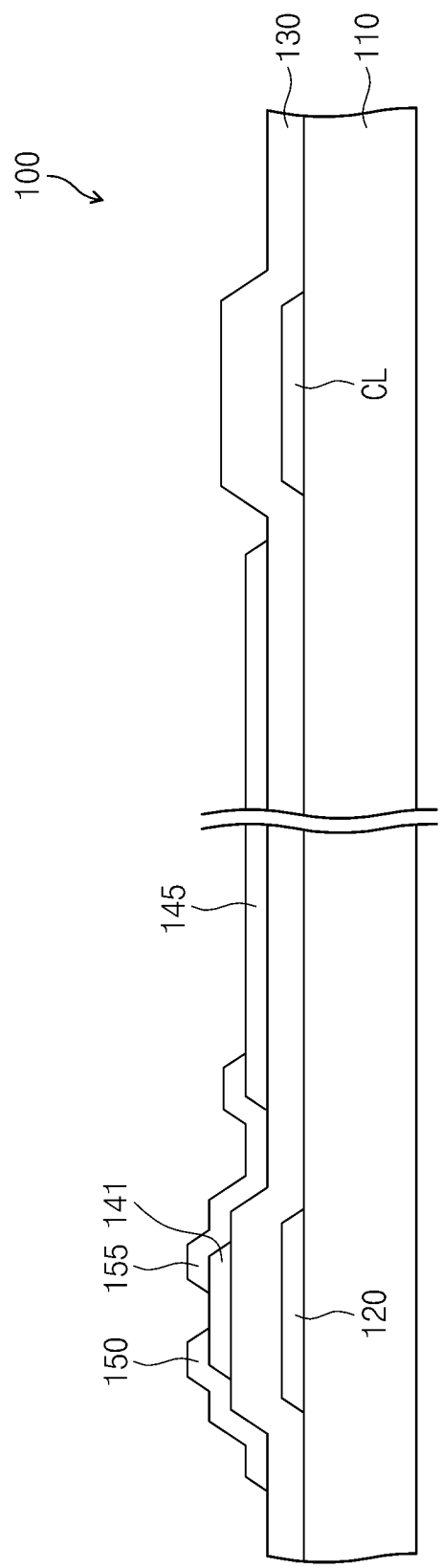

Referring to FIGS. 7A and 7B, a data line pattern is formed on the insulating substrate 110 including the first semiconductor pattern 141 and the pixel electrode 145, using a second conductive material. The data line pattern includes the data lines DL, the source electrode 150 and the drain electrode 155. The data line pattern is formed by depositing the second conductive material over the insulating substrate 110 to form a second conductive layer (not shown) and patterning the second conductive layer by a photolithography process using a third mask (not shown). The source electrode 150 makes contact with a first portion of the first semiconductor pattern 141, and the drain electrode 155 is spaced apart from the source electrode 150 and makes contact with a second portion of the first semiconductor pattern 141.

In the exemplary embodiment, the second conductive material may include a metal material, such as copper (Cu), molybdenum (Mo), aluminum (Al), tungsten (W), chromium (Cr), etc. The second conductive layer may have a single-layer structure, a multi-layer structure or an alloy-layer structure by using the second conductive material. In one exemplary embodiment, for instance, the second conductive layer has a multi-layer structure of molybdenum-aluminum-molybdenum (Mo—Al—Mo) or a molybdenum-aluminum (Mo—Al) alloy layer.

Figure 8A:
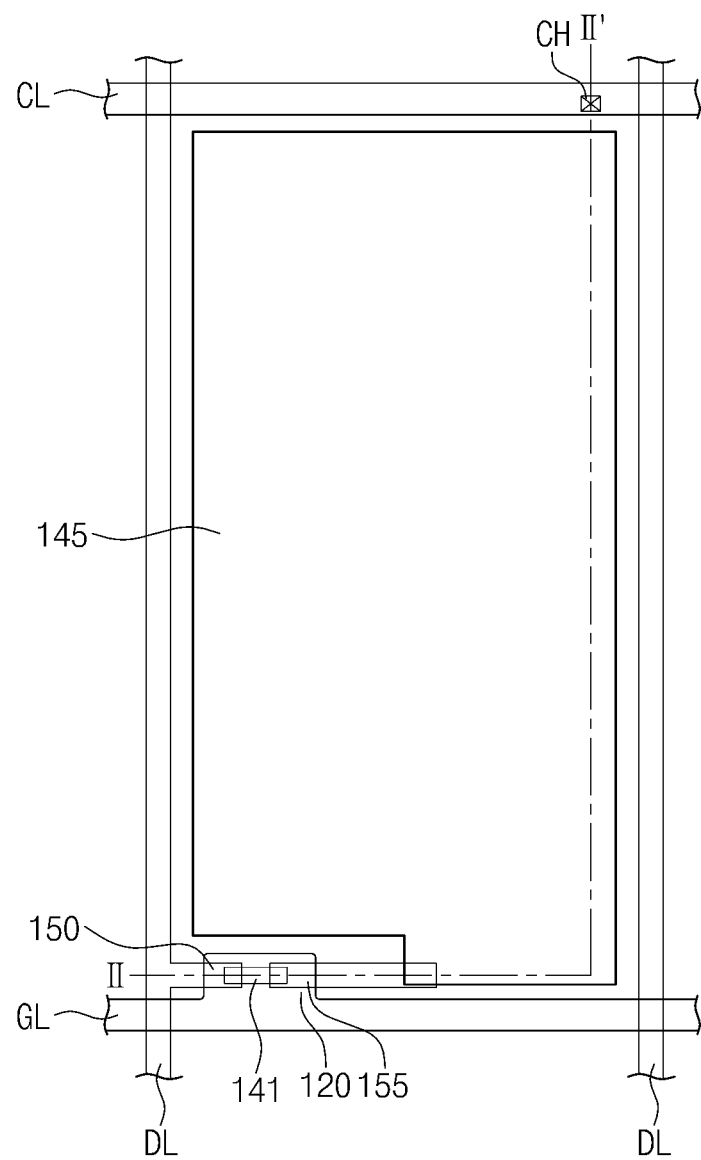
Figure 8B:
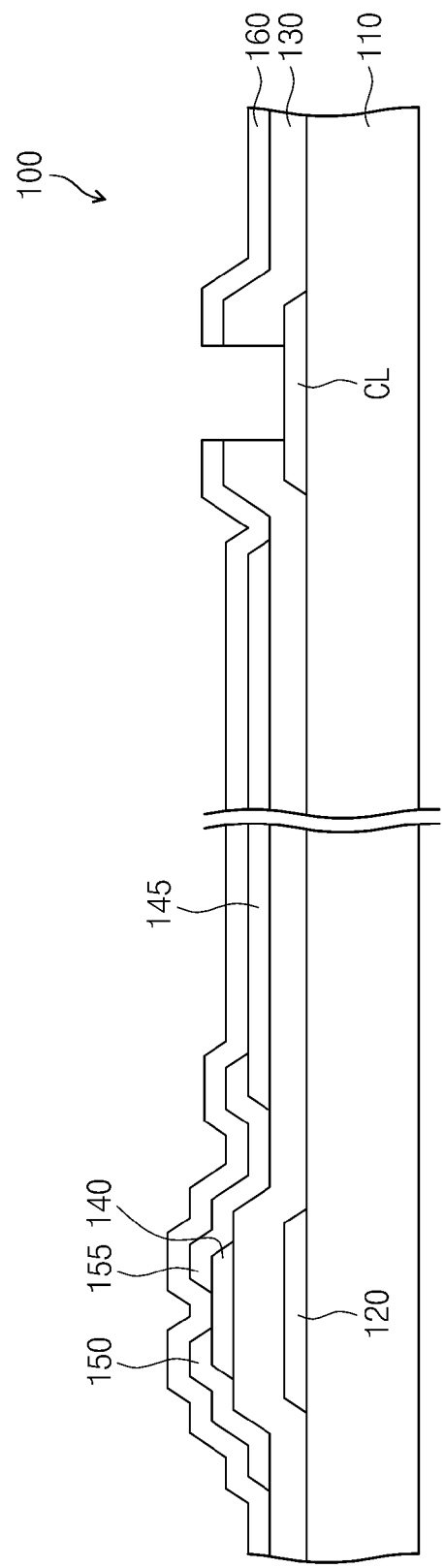

Referring to FIGS. 8A and 8B, an insulating material (not shown) is deposited over the whole surface of the insulating substrate 110 including the data line pattern. The insulating material (not shown) may include the organic insulating material or the inorganic insulating material, and may have the single-layer structure or the multi-layer structure. Then, the insulating material (not shown) is patterned through a photolithography process using a fourth mask (not shown) so as to form the insulating layer 160. In this process, the contact hole CH is formed extended through a thickness of the gate insulating layer 130 and the insulating layer 160, so that the portion of the common electrode line CL is exposed through the contact hole CH.

Figure 9A:
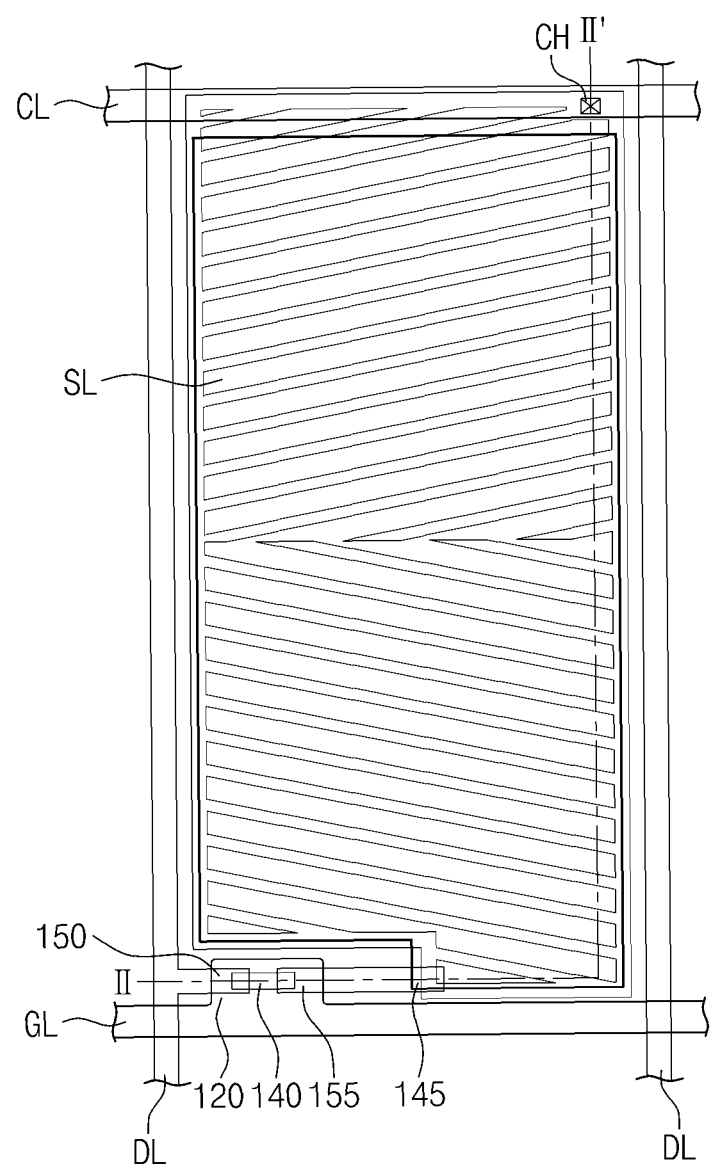
Figure 9B:
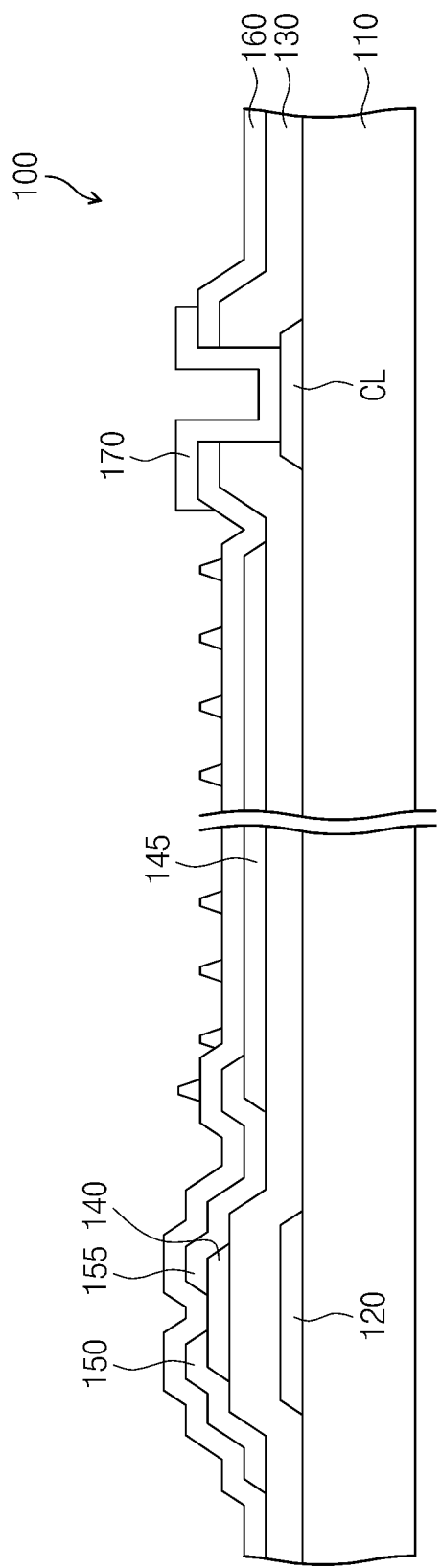

Referring to FIGS. 9A and 9B, a third conductive material (not shown) is deposited over the whole surface of the insulating substrate 110 including the insulating layer 160, to form a third conductive layer (not shown). The third conductive layer (not shown) is patterned by a photolithography process using a fifth mask (not shown) to form the common electrode 170. Through the patterning process using the fifth mask (not shown), the common electrode 170 includes the slits SL.

According to the exemplary embodiment of the manufacturing process of the thin film transistor substrate 100, the thin film transistor substrate 100 may be manufactured using five masks. Particularly, the first semiconductor pattern 141 and the pixel electrode 145 are formed using only one mask. Thus, the number of the masks required to manufacture the thin film transistor substrate 100 may be reduced, thereby reducing the manufacturing cost of the thin film transistor substrate 100.

Figure 10:
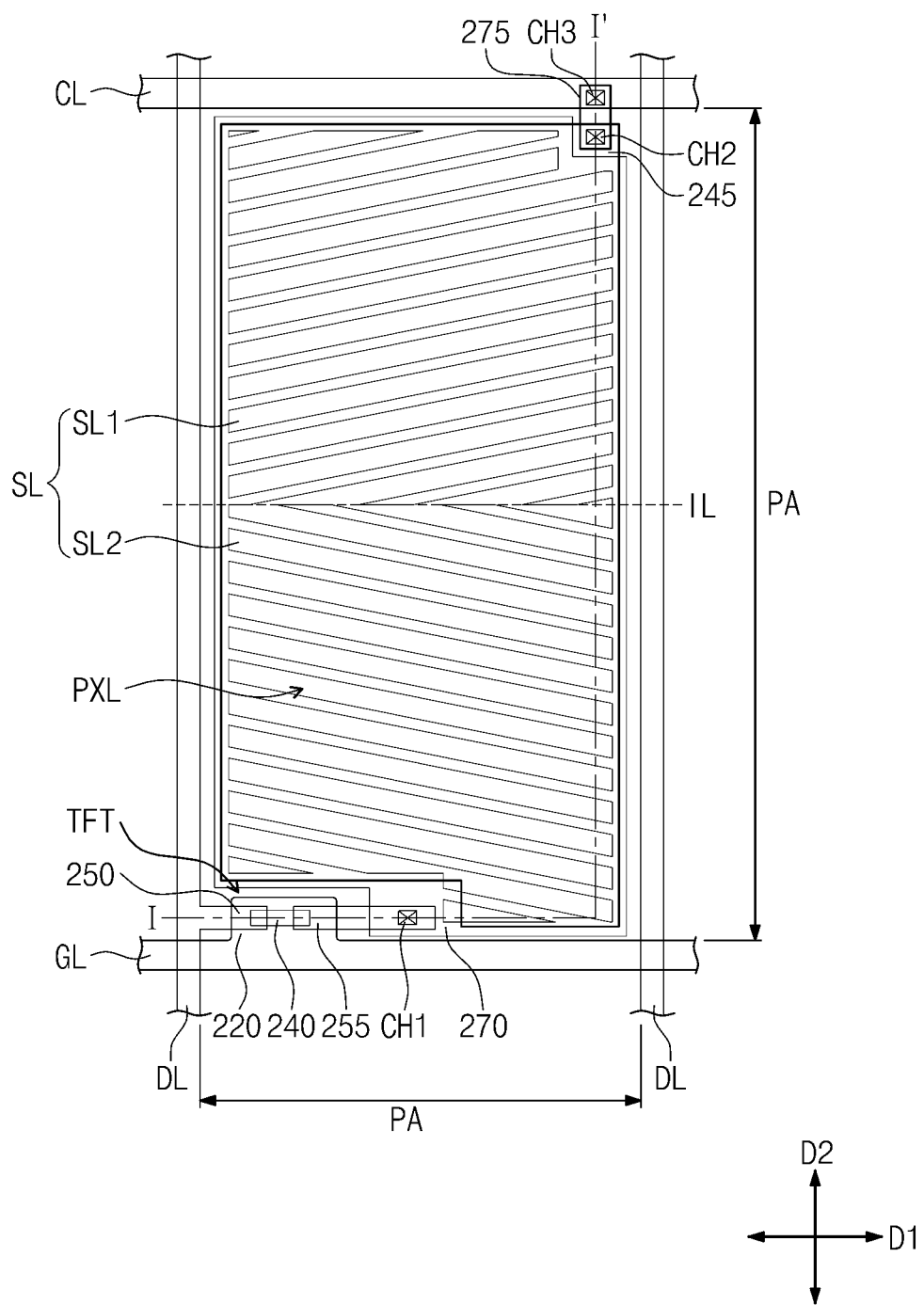
FIG. 10 is a plan view showing another exemplary embodiment of a thin film transistor substrate according to the invention.
Figure 11:
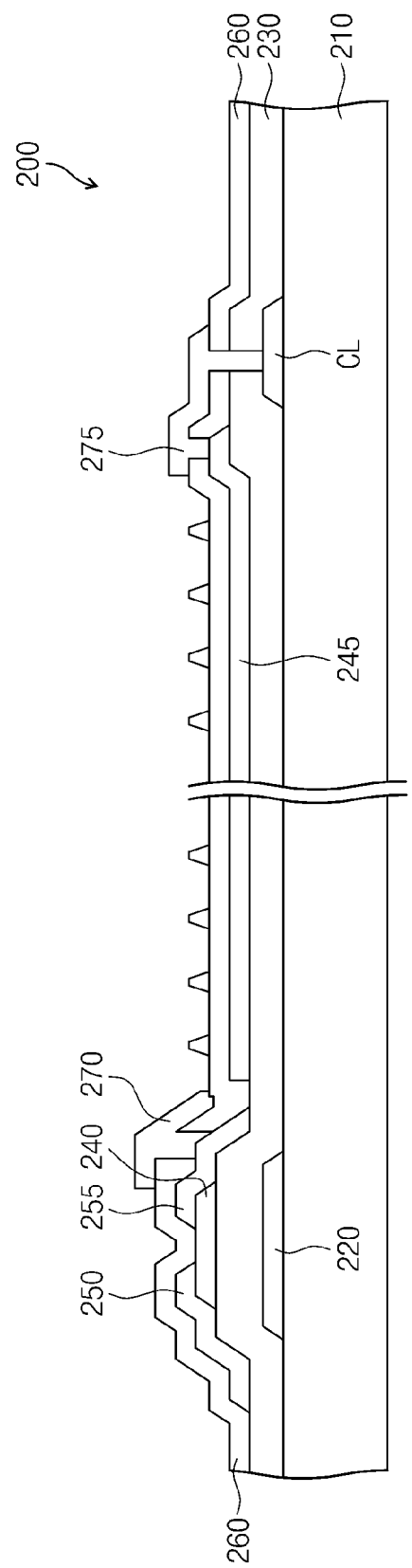
FIG. 11 is a cross-sectional view taken along line I-I' shown in FIG. 10.

FIG. 10 is a plan view showing another exemplary embodiment of a thin film transistor substrate 200 according to the invention and FIG. 11 is a cross-sectional view taken along line I-I' shown in FIG. 10.

In the exemplary embodiment of the thin film transistor substrate 200, a gate electrode 220, a common electrode line CL, a gate insulating layer 230, a semiconductor pattern 240, a source electrode 250 and a drain electrode 255 are substantially the same as those of the exemplary embodiment of the thin film transistor substrate 100 in FIG. 2 and FIG. 3 except for a common electrode 245, a pixel electrode 270 and an insulating layer 260. Hereinafter, the common electrode 245 and the pixel electrode 270 will be described in detail, and detailed descriptions of the same elements will be omitted.

The common electrode 245 and the semiconductor pattern 240 may be a same layer of the thin film transistor substrate 200, or the common electrode 245 may be disposed in and/or on the same layer of the thin film transistor substrate 200 as the semiconductor pattern 240. That is, the common electrode 245 may be disposed on the gate insulating layer 230. In addition, the common electrode 245 is spaced apart from the drain electrode 255 and electrically connected to the common electrode line CL.

The common electrode 245 may include a same material as the semiconductor pattern 240. That is, the common electrode 245 may include the amorphous indium-gallium-zinc-oxide ("a-IGZO").

The common electrode 245 has an electrical property different from that of the semiconductor pattern 240. The common electrode 245 has conductivity greater than conductivity of the semiconductor pattern 240, and has a conductor property.

The difference of the electrical property between the common electrode 245 and the semiconductor pattern 240 is caused by the variation of the electrical property when the amorphous indium-gallium-zinc-oxide ("a-IGZO") is irradiated by light such as an ultraviolet ray. In detail, when the amorphous indium-gallium-zinc-oxide ("a-IGZO") is irradiated by the ultraviolet ray, the amorphous indium-gallium-zinc-oxide ("a-IGZO") becomes the conductor after a predetermined time has lapsed.

The thin film transistor substrate 200 further includes the insulating layer 260 disposed on the source electrode 250, the drain electrode 255 and the common electrode 245. The insulating layer 260 includes an organic insulating material or an inorganic insulating material. The insulating layer 260 includes a first contact hole CH1 extended through a thickness thereof to expose a portion of an upper surface of the drain electrode 255 and a second contact hole CH2 extended through a thickness thereof to expose a portion of an upper surface of the common electrode 245. In addition, the insulating layer 260 and the gate insulating layer 230 include a third contact hole CH3 extended through thicknesses thereof to expose a portion of an upper surface of the common electrode line CL.

The pixel electrode 270 is disposed on the insulating layer 260. At least a portion of the pixel electrode 270 is overlapped with the common electrode 245 while interposing the insulating layer 260 therebetween. The pixel electrode 270 is electrically connected to the drain electrode 255 through the first contact hole CH1.

The pixel electrode 270 includes a plurality of slits SL. In FIG. 10, the slits SL include upper slits SL1 and lower slits SL2 divided by an imaginary line IL crossing the pixel area PA along the first direction D1. A longitudinal axis of the upper slits SL1 is extended from a right upper portion toward a left lower portion of an upper portion of the pixel area PA, and a longitudinal axis of the lower slits SL2 are extended from a right lower portion toward a left upper portion of a lower portion of the pixel area, but should not be limited thereto or thereby. In addition, the slits SL are disposed in the pixel electrode 270 in FIG. 10, but the slits SL may be disposed in one of the pixel electrode 270 and the common electrode 245.

The thin film transistor substrate 200 further includes a pixel electrode pattern 275. The pixel electrode pattern 275 is spaced apart from the pixel electrode 270 and disposed in and/or on the same layer as the pixel electrode 270. The pixel electrode pattern 275 electrically connects the common electrode 245 and the common electrode line CL through the second contact hole CH2 and the third contact hole CH3.

An exemplary embodiment of a method of manufacturing the thin film transistor substrate 200 is substantially similar to the exemplary embodiment of the method of manufacturing the thin film transistor substrate 100. That is, the masks used in the exemplary embodiment of the manufacturing method of the thin film transistor substrate 200 may have different shapes from the masks used in the exemplary embodiment of the manufacturing method of the thin film transistor substrate 100, but the number of the masks used in the exemplary embodiment of the manufacturing method of the thin film transistor substrate 200 is equal to the number of the masks used in the exemplary embodiment of the manufacturing method of the thin film transistor substrate 100, e.g., five masks. Thus, according to the exemplary embodiment of the manufacturing method of the thin film transistor substrate 200, the number of the masks may be reduced, thereby reducing the manufacturing cost of the thin film transistor substrate 200.

Figure 12:
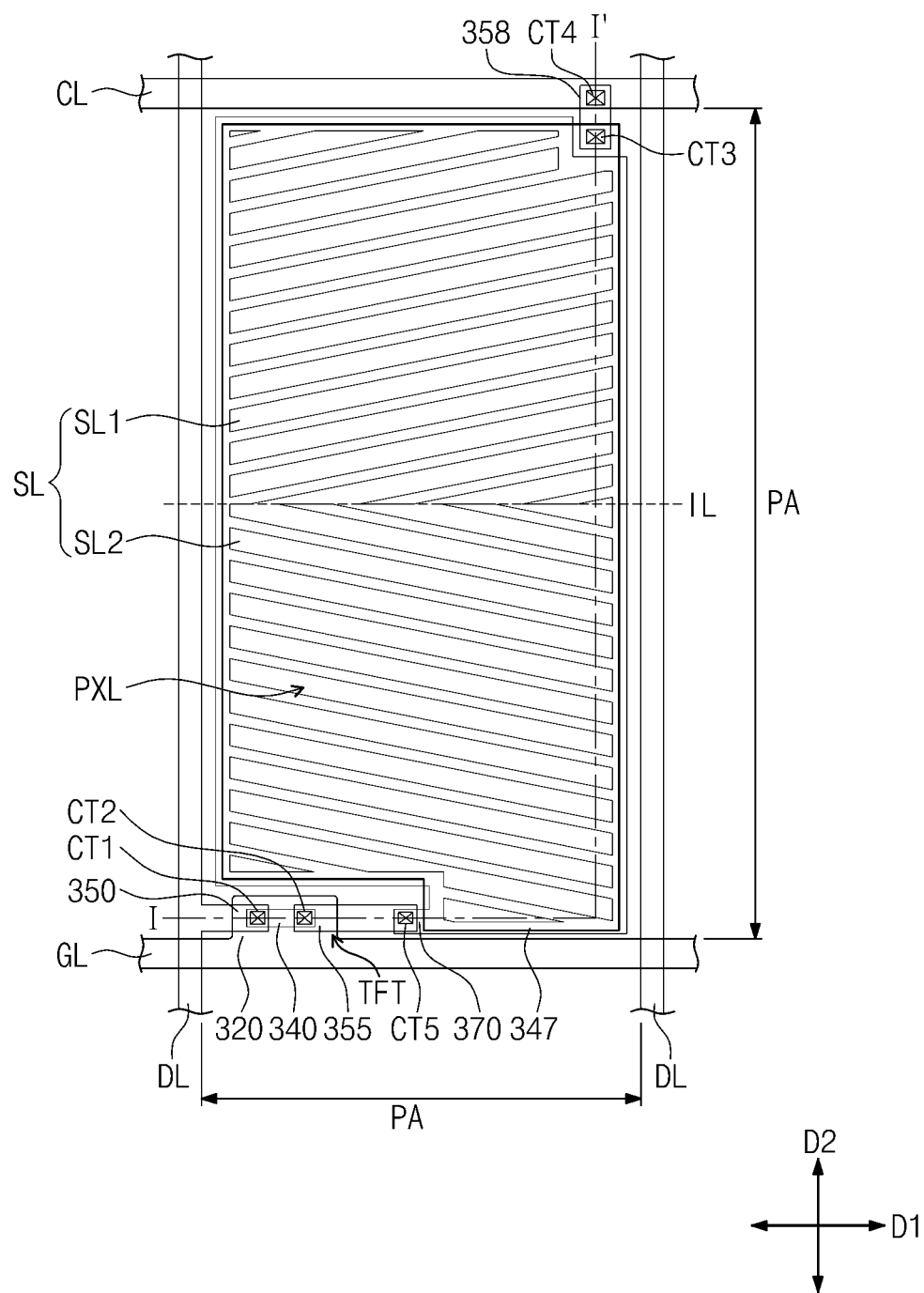
FIG. 12 is a plan view showing still another exemplary embodiment of a thin film transistor substrate according to the invention.
Figure 13:
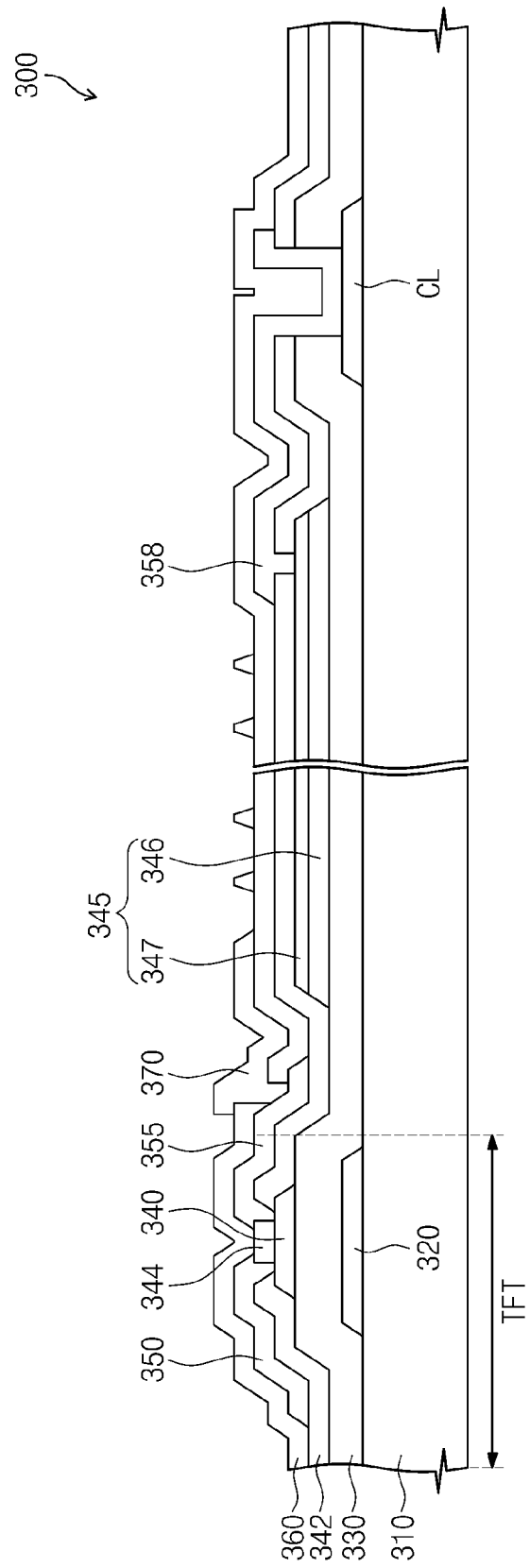
FIG. 13 is a cross-sectional view taken along line I-I' shown in FIG. 12.

FIG. 12 is a plan view showing still another exemplary embodiment of a thin film transistor substrate according to the invention and FIG. 13 is a cross-sectional view taken along line I-I' shown in FIG. 12.

Referring to FIGS. 12 and 13, the thin film transistor 300 includes an insulating substrate 310 including a plurality of pixel areas PA, a plurality of gate lines, a plurality of data lines, a plurality of common electrode lines and a plurality of pixels PXL. In the exemplary embodiment, since the pixels PXL have the same structure and function, for the convenience of explanation, one pixel PXL of the pixels, one gate line GL, one common electrode line CL and two data lines DL are shown in FIGS. 12 and 13.

The insulating substrate 310 includes a transparent insulating material. The pixel areas PA are arranged on the insulating substrate 310 in a matrix form.

The gate line GL has a longitudinal axis which is extended in a first direction D1 on the insulating substrate 310. The common electrode line CL has a longitudinal axis which is extended substantially in parallel with the first direction D1 and is spaced apart from the gate line GL in a second direction D2 crossing the first direction D1. The data lines DL have a longitudinal axis which are extended in the second direction D2. The gate line GL and the common electrode line CL may be a same layer of the thin film transistor substrate 300, or may be disposed in or on the same layer of the thin film transistor substrate 300. A gate insulating layer 330 is disposed between the gate line GL and the data lines DL, so that the gate line GL is insulated from the data lines DL by the gate insulating layer 330. Similarly, the gate insulating layer 330 is disposed between the common electrode line CL and the data lines DL, and thus the common electrode line CL is insulated from the data lines DL by the gate insulating layer 330.

The pixel PXL is disposed corresponding to one pixel area PA of the pixel areas. The pixel area PA may have various shapes. In one exemplary embodiment, the pixel area PA is defined by the gate line GL, the data lines DL and the common electrode line CL, but is not limited thereto or thereby.

The pixel PXL includes a thin film transistor TFT, a common electrode part 345 and a pixel electrode 370 connected to the thin film transistor TFT.

The thin film transistor TFT includes a gate electrode 320, the gate insulating layer 330, a semiconductor pattern 340, an etch stopper 344, a source electrode 350 and a drain electrode 355.

The gate electrode 320 is protruded from the gate line GL. The gate electrode 320 is disposed on the insulating substrate 310.

The gate insulating layer 330 is disposed on the insulating substrate 310 to cover (e.g., overlap) the gate electrode 320. The gate insulating layer 330 includes an organic insulating material and/or an inorganic insulating material.

The semiconductor pattern 340 is disposed on the gate insulating layer 330. The semiconductor pattern 340 faces the gate electrode 320 while the gate insulating layer 330 is interposed therebetween. When viewed in the plan view, the semiconductor pattern 340 is covered by the gate electrode 320. The semiconductor pattern 340 may include an oxide semiconductor, such as amorphous indium-gallium-zinc-oxide ("a-IGZO").

The common electrode part 345 and the semiconductor pattern 340 may be a same layer of the thin film transistor substrate 300, or the common electrode part 345 may be disposed in and/or on a same layer of the thin film transistor substrate 300 as the semiconductor pattern 340. That is, the common electrode part 345 is disposed on the gate insulating layer 330. The common electrode part 345 is spaced apart from the semiconductor pattern 340. The common electrode part 345 includes more layers than the semiconductor pattern 340.

The common electrode part 345 includes a semiconductor layer 346 and a conductive layer 347. The semiconductor layer 346 and the semiconductor pattern 340 may be a same layer of the thin film transistor substrate 300, or the semiconductor layer 346 may be disposed in and/or on a same layer as the semiconductor pattern 340. That is, the semiconductor layer 346 is disposed on the gate insulating layer 330. The semiconductor layer 346 is spaced apart from the semiconductor pattern 340. The semiconductor layer 346 may include the same material as the semiconductor pattern 340. Accordingly, the semiconductor layer 346 may include the same oxide semiconductor, such as amorphous indium-gallium-zinc-oxide ("a-IGZO"), as the semiconductor pattern 340.

The conductive layer 347 is disposed on the semiconductor layer 346 to correspond to the semiconductor layer 346, for example, having substantially the same planar profile and/or location as the semiconductor layer 346. The conductive layer 347 is electrically connected to the common electrode line CL. The conductive layer 347 includes a transparent conductive material, such as gallium-zinc-oxide ("GZO") or zinc oxide (ZnO). The conductive layer 347 may be used as a common electrode that receives a common voltage from the common electrode line CL.

The thin film transistor substrate 300 further includes a first insulating layer 342 on the semiconductor pattern 340. The first insulating layer 342 includes an insulating material, such as silicon nitride, silicon oxide, etc. The first insulating layer 342 includes first, second and third contact holes CT1, CT2 and CT3 extended through a thickness thereof. The first and second contact holes CT1 and CT2 are spaced apart from each other in the plan view and expose a portion of an upper surface of the semiconductor pattern 340. The third contact hole CT3 exposes a portion of an upper surface of the conductive layer 347. The first insulating layer 342 and the gate insulating layer 330 include a fourth contact hole CT4 extended through thicknesses thereof to expose a portion of an upper surface of the common electrode line CL.

At least a portion of the first insulating layer 342 makes contact with the portion of the upper surface of the semiconductor pattern 340 between the first and second contact holes CT1 and CT2. The portion of the first insulating layer 342, which makes contact with the portion of the upper surface of the semiconductor pattern 340, serves as the etch stopper 344. The etch stopper 344 covers a channel area (not shown) of the semiconductor pattern 340.

The source electrode 350 and the drain electrode 355 are disposed on the first insulating layer 342 and the etch stopper 344. The source electrode 350 is branched from the data line DL. When viewed in the plan view, the source electrode 350 is partially overlapped with the semiconductor pattern 340. The source electrode 350 is electrically connected to the semiconductor pattern 340 through the first contact hole CT1. The drain electrode 355 is spaced apart from the source electrode 350 and partially overlapped with the semiconductor pattern 340. The drain electrode 355 is electrically connected to the semiconductor pattern 340 through the second contact hole CT2.

The thin film transistor substrate 300 further includes an electrode pattern 358. The electrode pattern 358 is spaced apart from the source electrode 350 and the drain electrode 355. the electrode pattern 358, the source electrode 350 and the drain electrode 355 may be a same layer of the thin film transistor substrate 300, or the electrode pattern 357 may be disposed in and/or on a same layer as the source and drain electrodes 350 and 355. The electrode pattern 358 is electrically connected between the conductive layer 347 and the common electrode line CL through the third and fourth contact holes CT3 and CT4.

The thin film transistor substrate 300 further includes a second insulating layer 360 on the source electrode 350, the drain electrode 355 and the electrode pattern 358. The second insulating layer 360 includes an organic insulating material or an inorganic insulating material. The second insulating layer 360 includes a fifth contact hole CT5 to expose a portion of an upper surface of the drain electrode 355.

The pixel electrode 370 is disposed on the second insulating layer 360. At least a portion of the pixel electrode 370 is overlapped with the common electrode 345 while the second insulating layer 360 is interposed therebetween. The pixel electrode 370 is electrically connected to the drain electrode 355 through the fifth contact hole CT5. The pixel electrode 370 includes a plurality of slits SL. In FIG. 12, the slits SL include upper slits SL1 and lower slits SL2 divided by an imaginary line IL crossing the pixel area PA along the first direction D1. A longitudinal axis of the upper slits SL1 are extended from a right upper portion toward a left lower portion of an upper portion of the pixel area PA, and a longitudinal axis of the lower slits SL2 are extended from a right lower portion toward a left upper portion of a lower portion of the pixel area PA, but should not be limited thereto or thereby. In addition, the slits SL are disposed in the pixel electrode 370 in FIG. 12, but the slits SL may be disposed in one of the pixel electrode 370 and the common electrode part 345.

According to the exemplary embodiment of the thin film transistor substrate 300, the etch stopper 344 is disposed on the semiconductor pattern 340 so as to prevent the semiconductor pattern 340 from being damaged and reduce the manufacturing cost of the thin film transistor substrate 300.

Hereinafter, an exemplary embodiment of a manufacturing method of the thin film transistor substrate 300 shown in FIGS. 12 and 13 will be described.

FIGS. 14A, 15A, 16A, 17A, 18A and 19A are plan views showing an exemplary embodiment of a process of manufacturing the thin film transistor substrate shown in FIGS. 12 and 13, and FIGS. 14B, 15B, 15C, 15D, 15E, 16B, 17B, 18B and 19B are cross-sectional views showing the exemplary embodiment of the process of manufacturing the thin film transistor substrate shown in FIGS. 12 and 13, taken along a line II-II' shown in each of FIGS. 14A, 15A, 16A, 17A, 18A and 19A.

Figure 14A:
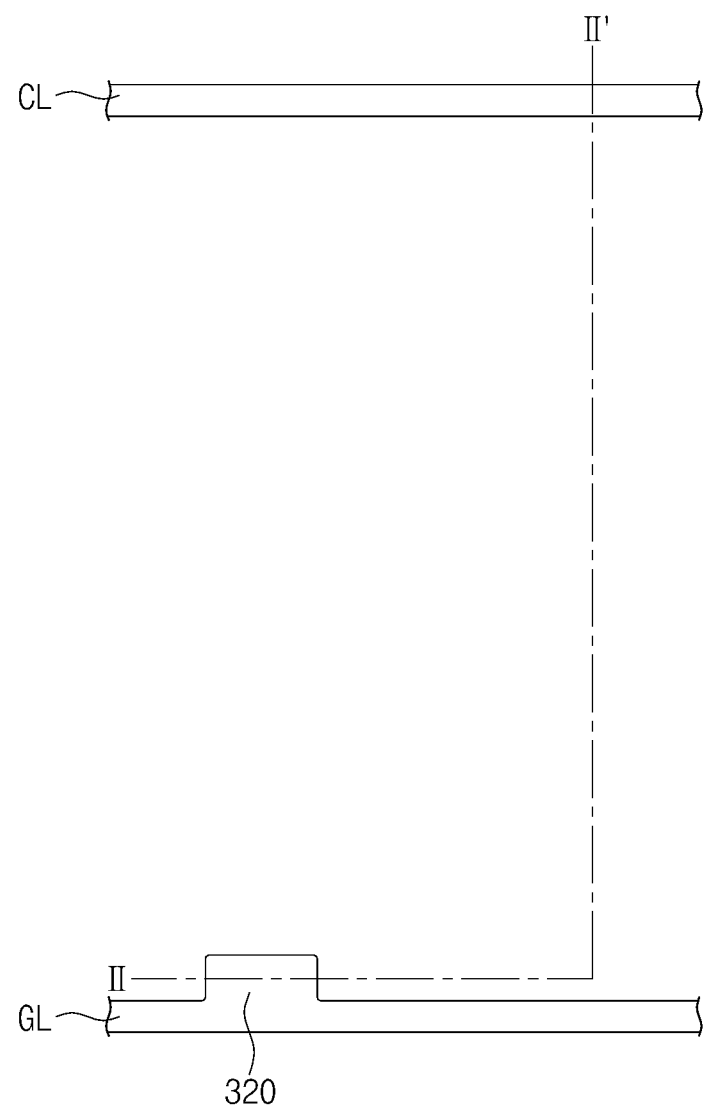
FIGS. 14A, 15A, 16A, 17A, 18A, and 19A are plan views showing an exemplary embodiment of a process of manufacturing the thin film transistor substrate shown in FIGS. 12 and 13.
Figure 14B:
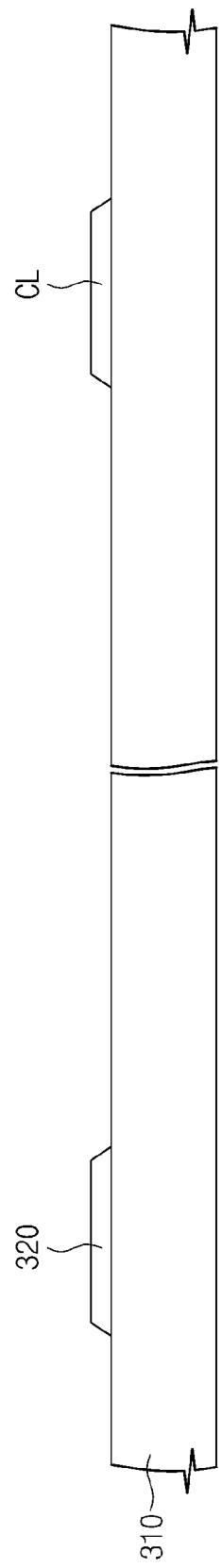
FIGS. 14B, 15B, 15C, 15D, 15E, 16B, 17B, 18B, and 19B are cross-sectional views showing the exemplary embodiment of the process of manufacturing the thin film transistor substrate shown in FIGS. 12 and 13, taken along line II-II' shown in each of FIGS. 15A, 16A, 17A, 18A, and 19A.

Referring to FIGS. 14A and 14B, a gate line pattern is formed on the insulating substrate 310, which includes the transparent insulating material, using a first conductive material. The gate line pattern includes the gate electrode 320, the gate line GL and the common electrode line CL. The gate line pattern is formed by depositing the first conductive material over the insulating substrate 310 to form a first conductive layer (not shown) and patterning the first conductive layer through a photolithography process using a first mask (not shown).

In the exemplary embodiment, the first conductive material may include a metal material, such as copper (Cu), molybdenum (Mo), aluminum (Al), tungsten (W), chromium (Cr), etc., and the first conductive layer may have a single-layer structure, a multi-layer structure or an alloy-layer structure by using the first conductive material. In one exemplary embodiment, for instance, the first conductive layer has a multi-layer structure of molybdenum-aluminum-molybdenum (Mo—Al—Mo) or a molybdenum-aluminum (Mo—Al) alloy layer.

A process of forming the semiconductor pattern 340 and the common electrode part 345 using one mask will be described in detail with reference to FIGS. 15A to 15E.

Figure 15A:
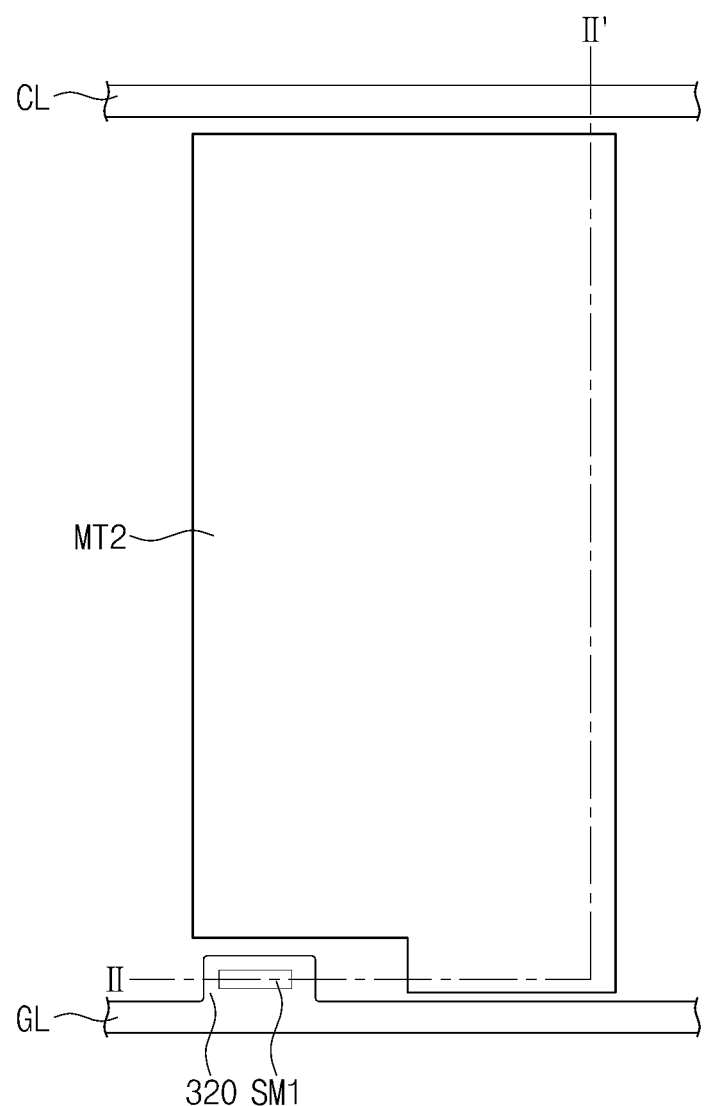
Figure 15B:
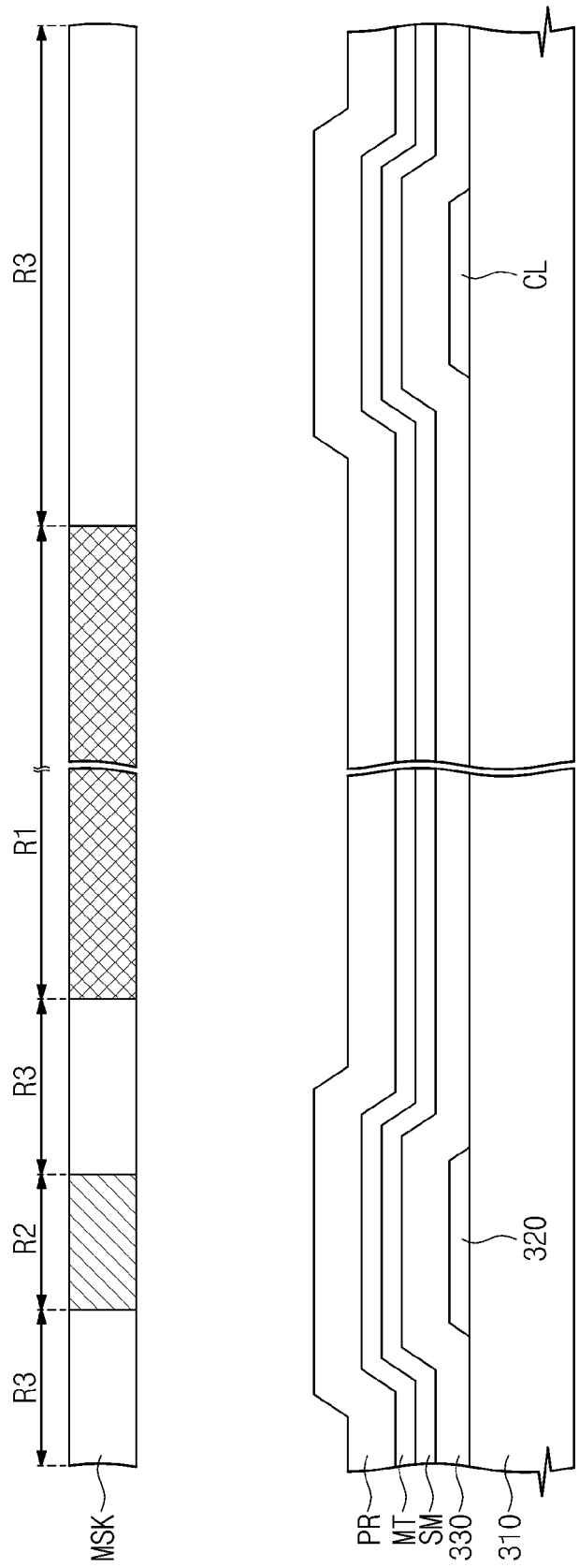

Referring to FIG. 15B, the gate insulating layer 330 is formed over the entire surface of the insulating substrate 310 including the gate electrode 320, the gate line GL and the common electrode line CL. The gate insulating layer 330 covers the gate electrode 320, the gate line GL and the common electrode line CL. The gate electrode 320, the gate line GL and the common electrode line CL are insulated from other conductive layers by the gate insulating layer 330.

A semiconductor thin layer SM and a second conductive layer MT are sequentially deposited on the whole surface of the insulating substrate 310 including the gate insulating layer 330. The semiconductor thin layer SM may include amorphous indium-gallium-zinc-oxide("a-IGZO"), and the second conductive layer MT may include gallium-zinc-oxide ("GZO") or zinc oxide (ZnO).

A photoresist layer PR is formed over the insulating substrate 310 using a photoresist material, and a light is irradiated onto the photoresist layer PR through a second mask MSK.

The second mask MSK is a slit mask or a diffraction mask. The second mask MSK includes a first region R1 that blocks the light incident thereto, a second region R2 provided with a slit pattern to transmit a portion of the light and block a portion of the light, and a third region R3 that transmits the light incident thereto, and only the light passing through the second mask MSK is irradiated onto the photoresist layer PR. The upper surface of the insulating substrate 310 is disposed under the first region R1, the second region R2 and the third region R3 and divided into plural regions respectively corresponding to the first, second, and third regions R1, R2, and R3. Thus, the regions of the insulating substrate 310 are referred to as first, second and third regions R1, R2, and R3, respectively.

Figure 15C:
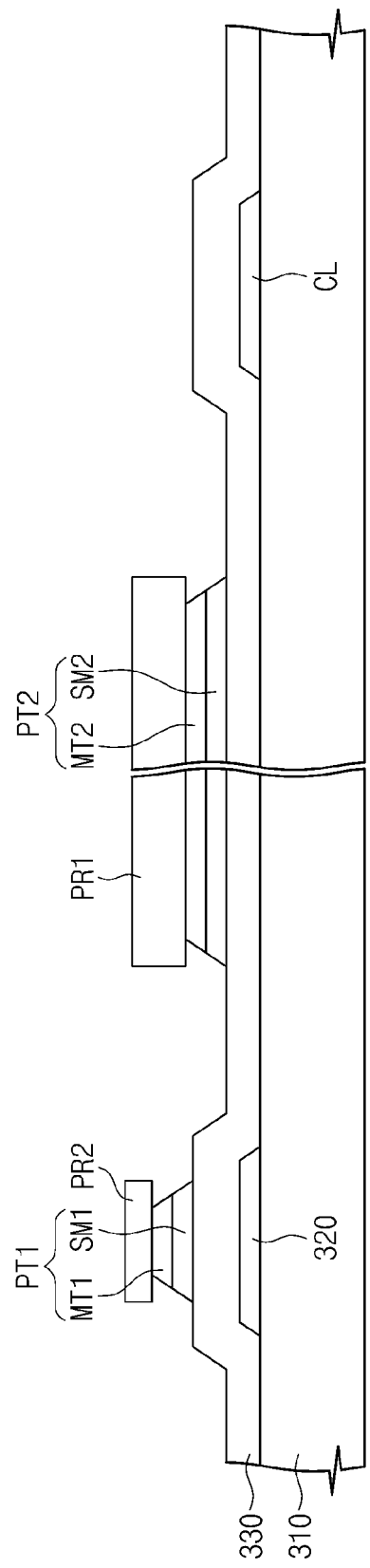

The photoresist layer PR exposed to the light through the second mask MSK is developed, as shown in FIG. 15C. A first photoresist layer PR1 and a second photoresist layer PR2 remain in the first region R1 that blocks the light and the second region R2 that partially transmits the light, respectively. The photoresist layer PR is completely removed from the third region R3 that transmits the light, such that a portion of the second conductive layer MT is exposed.

Since the exposure amount in the second region R2 is larger than that in the first region R1, the second photoresist layer PR2 has a thickness smaller than a thickness of the first photoresist layer pattern PR1. The thicknesses are taken perpendicular to the insulating substrate 310

In the exemplary embodiment, the photoresist layer PR includes a positive photoresist, in which the exposed portion of the photoresist layer PR is removed, but should not be limited thereto or thereby. That is, according to alternative exemplary embodiments, a negative photoresist, in which the exposed portion of the photoresist layer PR remains, may be used for the photoresist layer PR.

As shown in FIG. 15C, a portion of the semiconductor thin layer SM and a portion of the second conductive layer MT which are not covered by the first photoresist pattern PR1 and the second photoresist pattern PR2 are selectively removed, using the first photoresist pattern PR1 and the second photoresist pattern PR2 as masks. Accordingly, a first pattern PT1 and a second pattern PT2 are formed on the gate insulating layer 330. The first pattern PT1 is overlapped with the gate electrode 320, and the second pattern PT2 is spaced apart from the first pattern PT1. The first pattern PT1 includes a first semiconductor thin layer pattern SM1 and first conductive pattern MT1, and the second pattern PT2 includes a second semiconductor thin layer pattern SM2 and a second conductive layer pattern MT2.

Figure 15D:
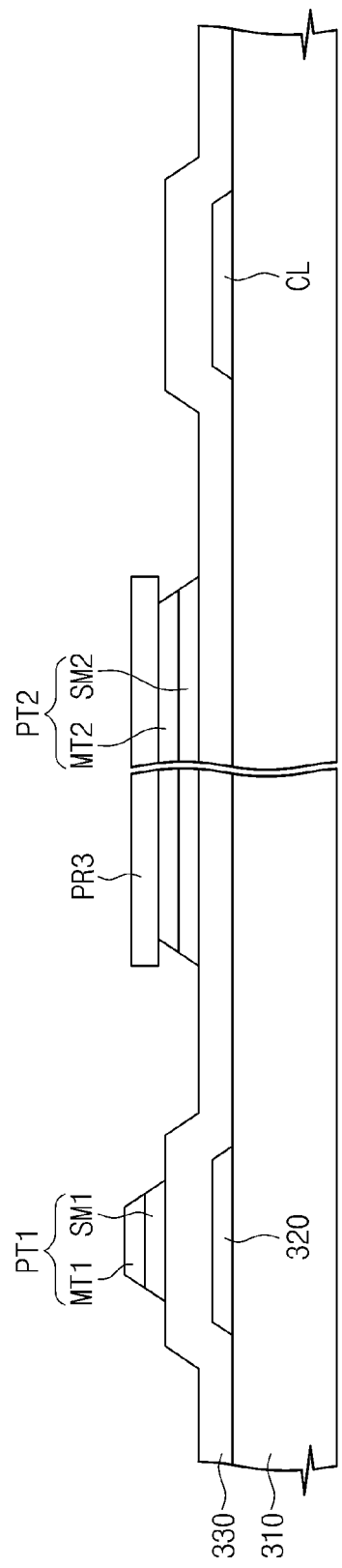

As shown in FIG. 15D, when portions of the first photoresist pattern PR1 and the second photoresist pattern PR2 are removed by an ashing process or an etchback process, the second photoresist layer pattern PR2 corresponding to the second region R2 to which the diffraction exposure is applied is removed, and the upper surface of the first conductive pattern MT1 is exposed.

In this case, a thickness of a portion of the first photoresist pattern PR1 substantially corresponds to a thickness of the second conductive pattern PR2 is removed, so as to form a third photoresist pattern PR3. As a result, since the third photoresist pattern PR3 remains only in the first region R1 of the insulating substrate 310, the upper surface of the first pattern PT1 is exposed and the upper surface of the second pattern PT2 is covered by the third photoresist pattern PR3.

Figure 15E:
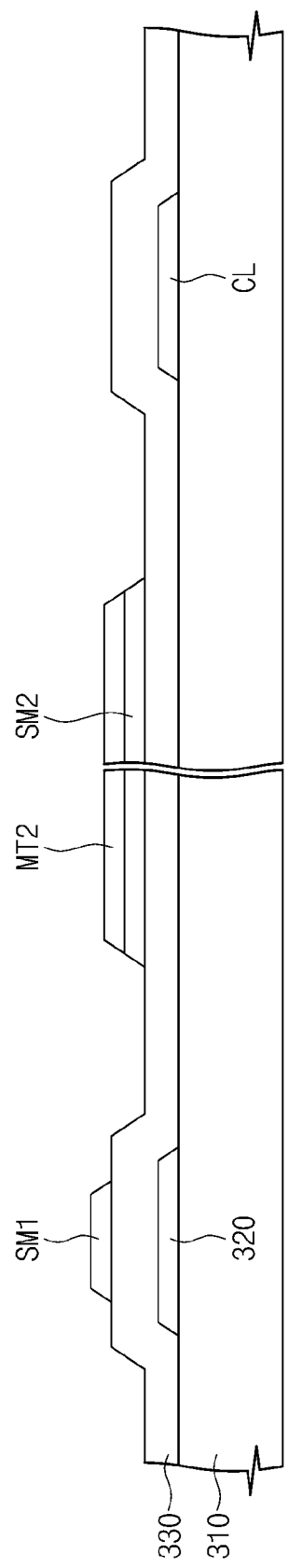

Referring to FIG. 15E, the first conductive pattern MT1 of the first pattern PT1 is removed by an etch process using the third photoresist layer pattern PR3 as a mask.

The first conductive pattern MT1 may be removed by a wet etch process using an etchant having an etch rate, which is greater for the first conductive pattern MT1 than for the first semiconductor thin layer pattern SM1. In one exemplary embodiment, a chemical material having the etch rate, which is above fifty time greater for the first conductive pattern MT1 than for the first semiconductor thin layer pattern SM1, is used as the etchant. In an exemplary embodiment where the first semiconductor thin layer pattern SM1 includes amorphous indium-gallium-zinc-oxide ("a-IGZO") and the first conductive layer pattern MT1 includes gallium-zinc-oxide ("GZO"), the chemical material containing fluorine ions (F⁻) may be used as the etchant. The chemical material containing the fluorine ions (F⁻) has the etch rate of about 1 to about 2 angstroms/sec with respect to gallium-zinc-oxide ("GZO"), but has the etch rate of about 100 angstroms/sec with respect to amorphous indium-gallium-zinc-oxide ("a-IGZO").

Accordingly, the first conductive layer pattern MT1 of the first pattern PT1 is removed and the first semiconductor thin layer pattern SM1 remains. The first semiconductor thin layer pattern SM1 is used as an active layer of the thin film transistor later formed.

Then, referring to FIGS. 15A and 15E, the third photoresist layer pattern PR3 is removed, and thus the upper surface of the second pattern PT2, e.g., the second conductive pattern MT2 is exposed. The second conductive pattern MT2 is connected to the common electrode line CL to be used as the common electrode.

Thus, the active layer and the common electrode of the thin film transistor substrate may be formed using one mask.

Figure 16A:
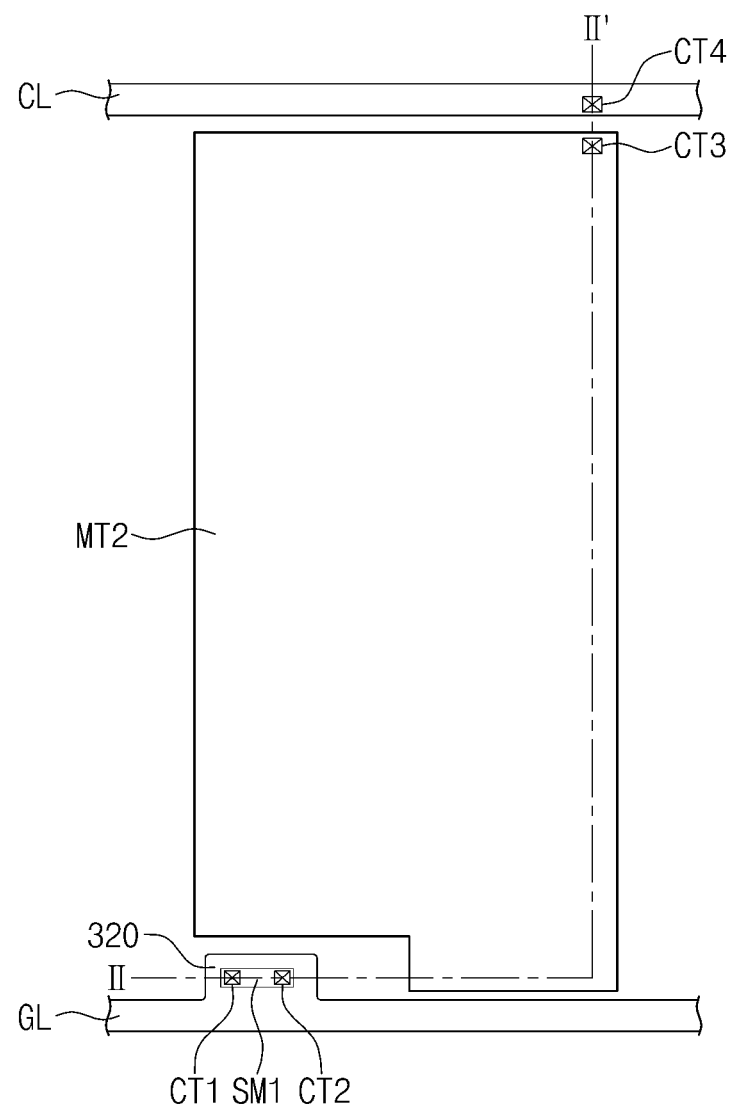
Figure 16B:
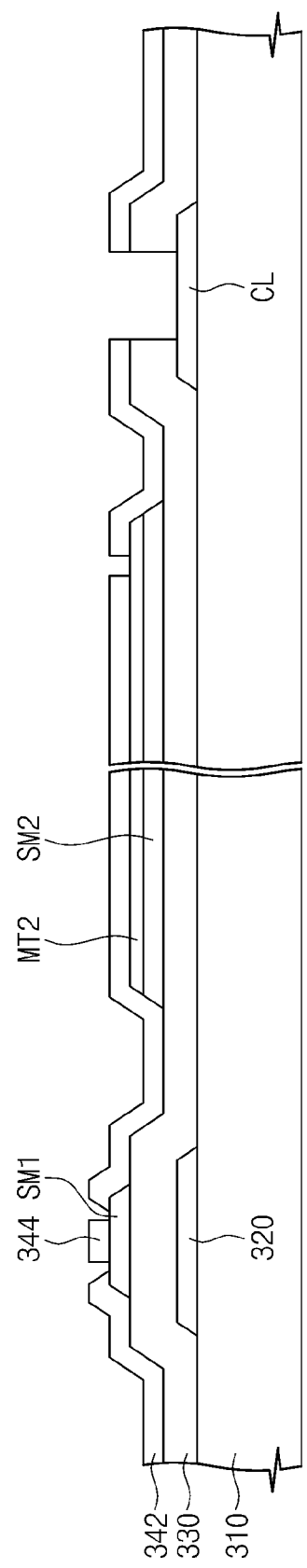

Referring to FIGS. 16A and 16B, a first insulating material (not shown) is deposited on the insulating substrate 310 including the first semiconductor thin layer pattern SM1 and the second conductive pattern MT2. The first insulating material (not shown) includes an organic insulating material or an inorganic insulating material and has a single-layer structure or a multi-layer structure. In one exemplary embodiment, for instance, the first insulating material (not shown) includes silicon oxide (SiOx) or silicon nitride (SiNx). The first insulating material (not shown) is patterned by a photolithography process using a third mask (not shown) to form a first insulating layer 342.

The first insulating material (not shown) includes the first to fourth contact holes CT1, CT2, CT3 and CT4 formed therethrough. The portion of the upper surface of the first semiconductor thin layer pattern SM1 is exposed through the first contact hole CT1 and the second contact hole CT2, the portion of the upper surface of the second conductive layer pattern MT2 is exposed through the third contact hole CT3, and the portion of the upper surface of the common electrode line CL is exposed through the fourth contact hole CT4.

The portion of the first insulating layer 342, which makes contact with the portion of the upper surface of the first semiconductor thin layer pattern SM1 between the first contact hole CT1 and the second contact hole CT2, is referred to as the etch stopper 344. The etch stopper 344 prevents the first semiconductor thin layer pattern SM1 from being etched when the source electrode and the drain electrode are patterned.

Figure 17A:
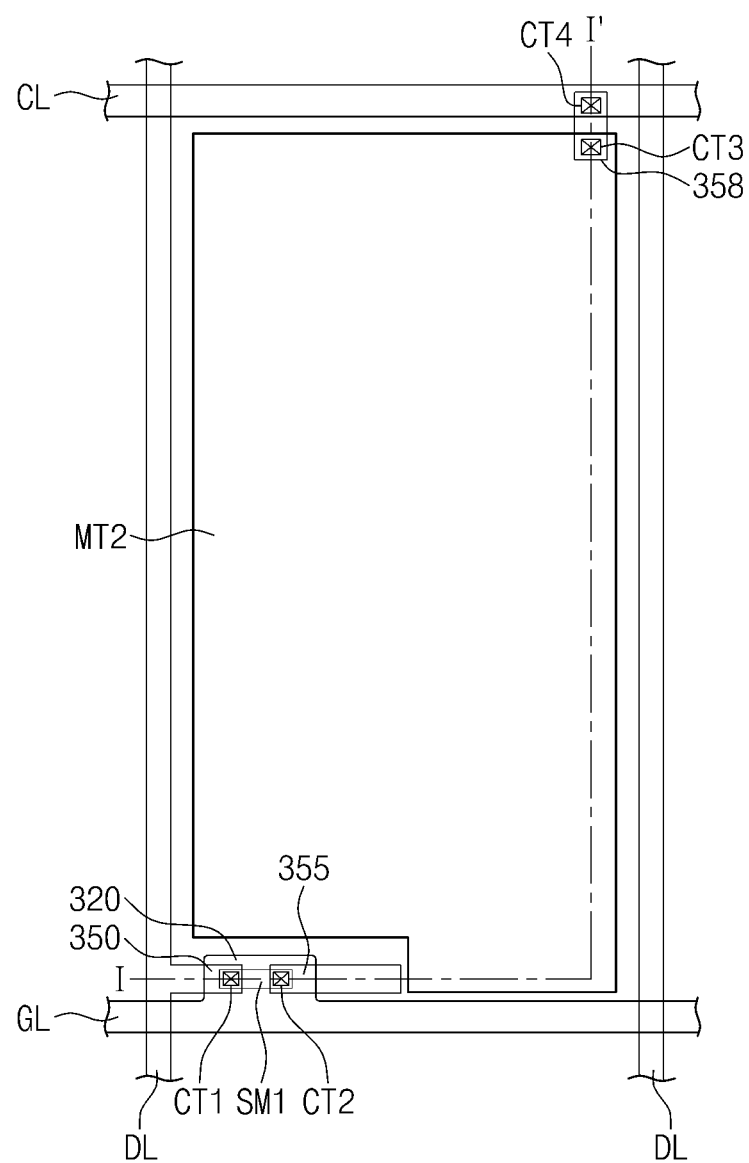
Figure 17B:
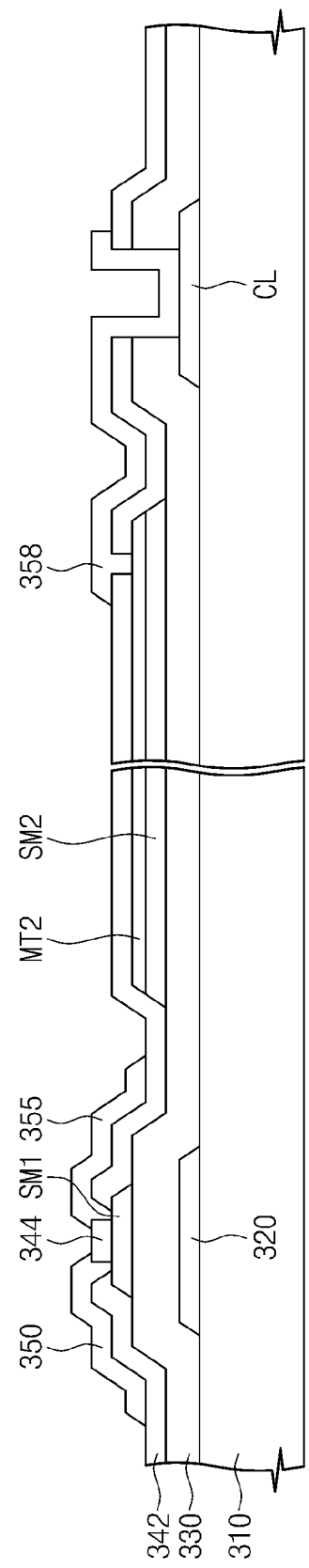

Then, referring to FIGS. 17A and 17B, a data line pattern is formed on the insulating substrate 310 including the first insulating layer 342 and the etch stopper 344, using a second conductive material. The data line pattern includes the data lines DL, the source electrode 350, the drain electrode 355 and the electrode pattern 358. The data line pattern is formed by depositing the second conductive material over the insulating substrate 310 to form the second conductive layer (not shown) and patterning the second conductive layer (not shown) through a photolithography process using a fourth mask (not shown). The source electrode 350 makes contact with a first portion of the first semiconductor thin layer pattern SM1 through the first contact hole CT1. The drain electrode 355 is spaced apart from the source electrode 350 and makes contact with a second portion of the first semiconductor thin layer pattern SM1 through the second contact hole CT2. In addition, the electrode pattern 358 makes contact with the second conductive pattern MT2 through the third contact hole CT3 and makes contact with the common electrode line CL through the fourth contact hole CT4.

In the exemplary embodiment, the second conductive material may include a metal material, such as copper (Cu), molybdenum (Mo), aluminum (Al), tungsten (W), chromium (Cr), etc. The second conductive layer may have a single-layer structure, a multi-layer structure or an alloy-layer structure by using the second conductive material. In one exemplary embodiment, for instance, the second conductive layer has a multi-layer structure of molybdenum-aluminum-molybdenum (Mo—Al—Mo) or a molybdenum-aluminum (Mo—Al) alloy layer.

Figure 18A:
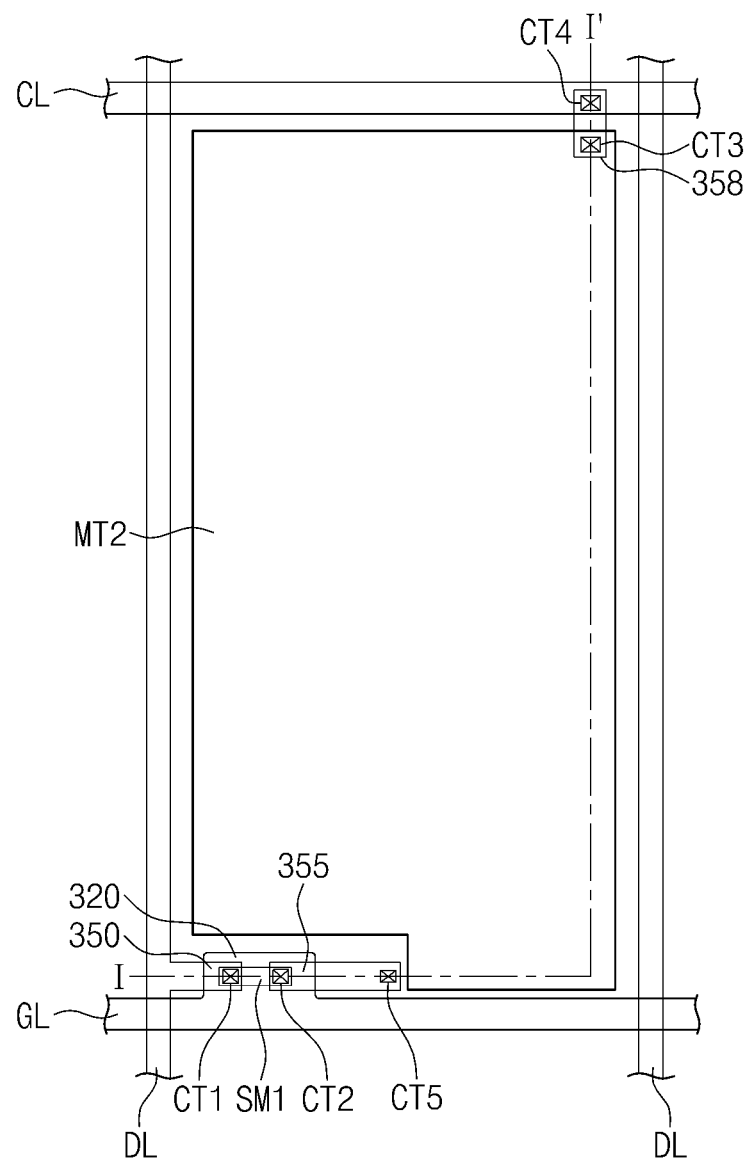
Figure 18B:
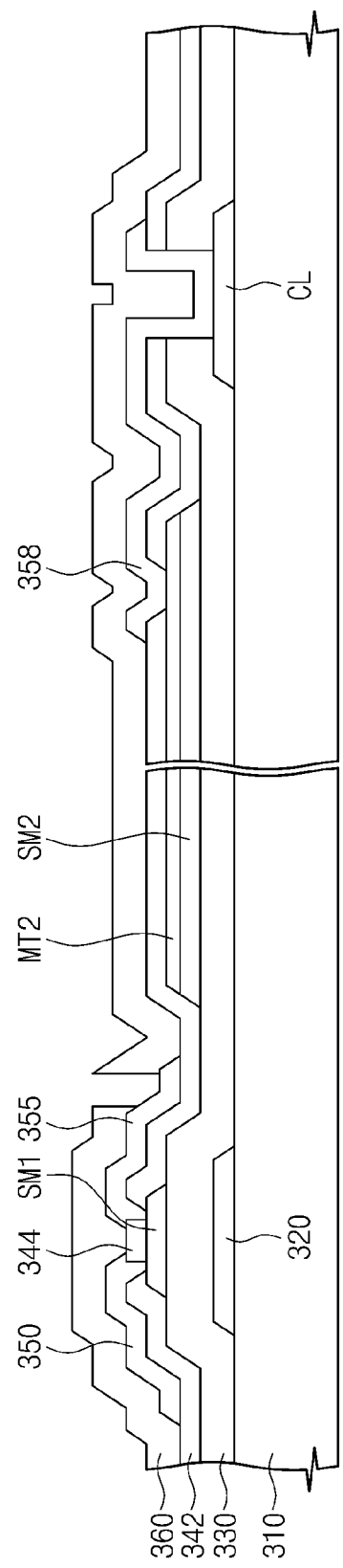

Referring to FIGS. 18A and 18B, a second insulating material (not shown) is deposited over the whole surface of the insulating substrate 310 including the data line pattern. The second insulating material (not shown) may include the organic insulating material or the inorganic insulating material and may have the single-layer structure or the multi-layer structure. Then, the second insulating material (not shown) is patterned through a photolithography process using a fifth mask (not shown) so as to form the second insulating layer 360. In this process, the fifth contact hole CT5 is formed through the second insulating material (not shown), so that the portion of the drain electrode line 355 is exposed through the fifth contact hole CT5 of the second insulating layer 360.

Figure 19A:
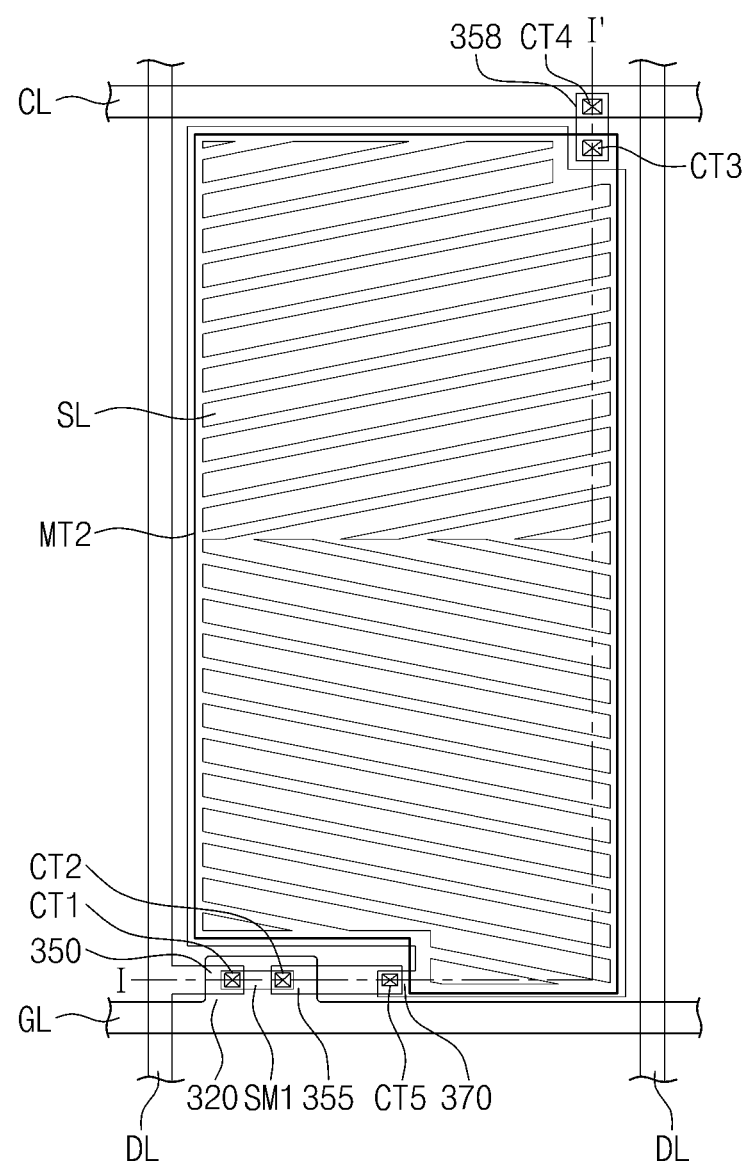
Figure 19B:
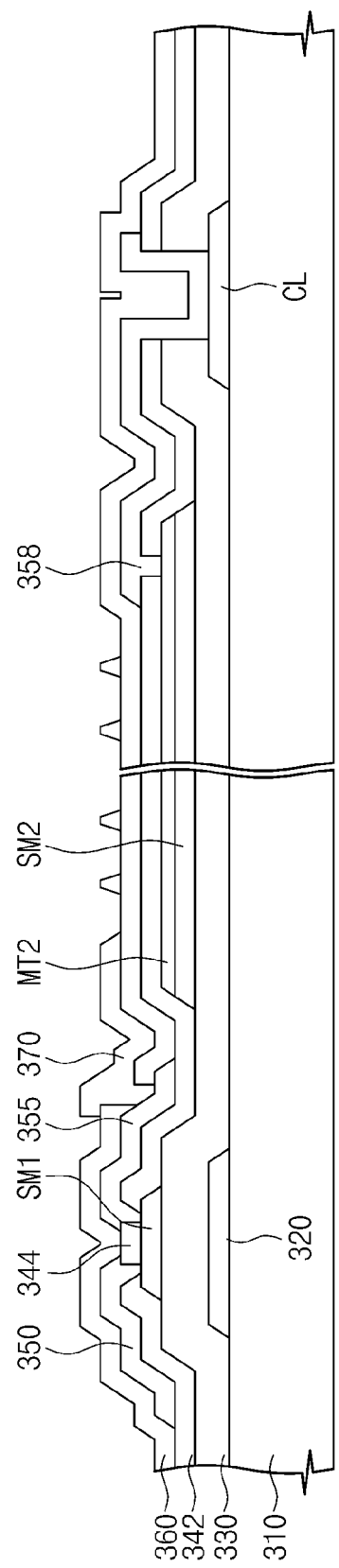

Referring to FIGS. 19A and 19B, a third conductive material (not shown) is deposited over the whole surface of the insulating substrate 310 including the second insulating layer 360, to form a third conductive layer (not shown). When the third conductive layer (not shown) is patterned by a photolithography process using a sixth mask (not shown), the pixel electrode 370 is formed. Through patterning process using the sixth mask (not shown), the pixel electrode 370 makes contact with the portion of the drain electrode 355 and includes the slits SL.

According to the exemplary embodiment of the manufacturing process of the thin film transistor substrate 300, the thin film transistor substrate 300 including the etch stopper 344 may be manufactured using six masks. Particularly, the first semiconductor thin layer pattern SM1 used as the active layer (semiconductor pattern 340) of the thin film transistor TFT and the second conductive pattern MT2 used as the common electrode part 345 are formed using only one mask. Thus, the number of the masks required to manufacture the thin film transistor substrate 300 may be reduced, to thereby reduce the manufacturing cost of the thin film transistor substrate 300.

Hereinafter, yet another exemplary embodiment of a thin film transistor substrate 400 according to the invention will be described in detail with reference to FIGS. 20 and 21.

Figure 20:
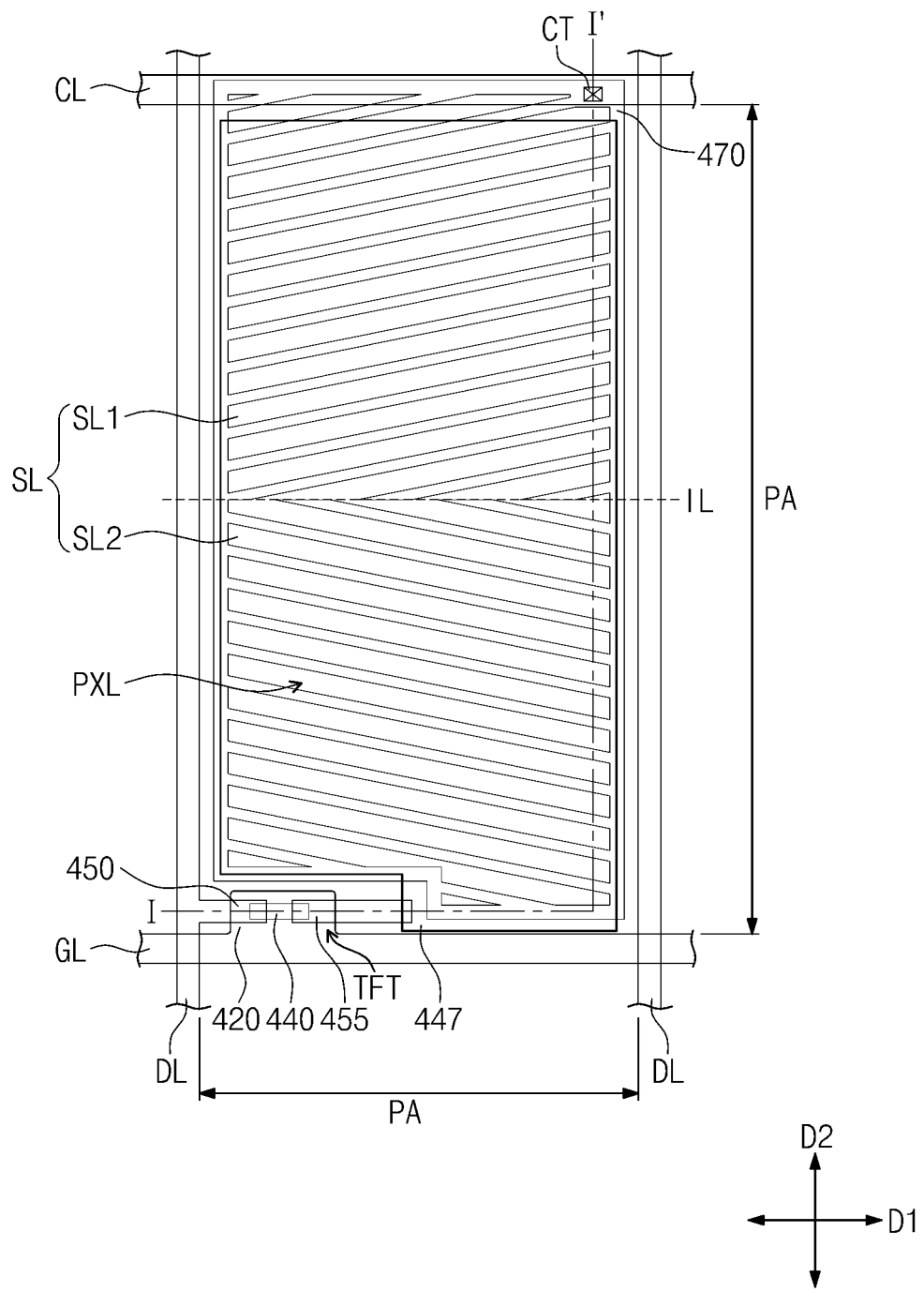
FIG. 20 is a plan view showing yet another exemplary embodiment of a thin film transistor substrate according to the invention.
Figure 21:
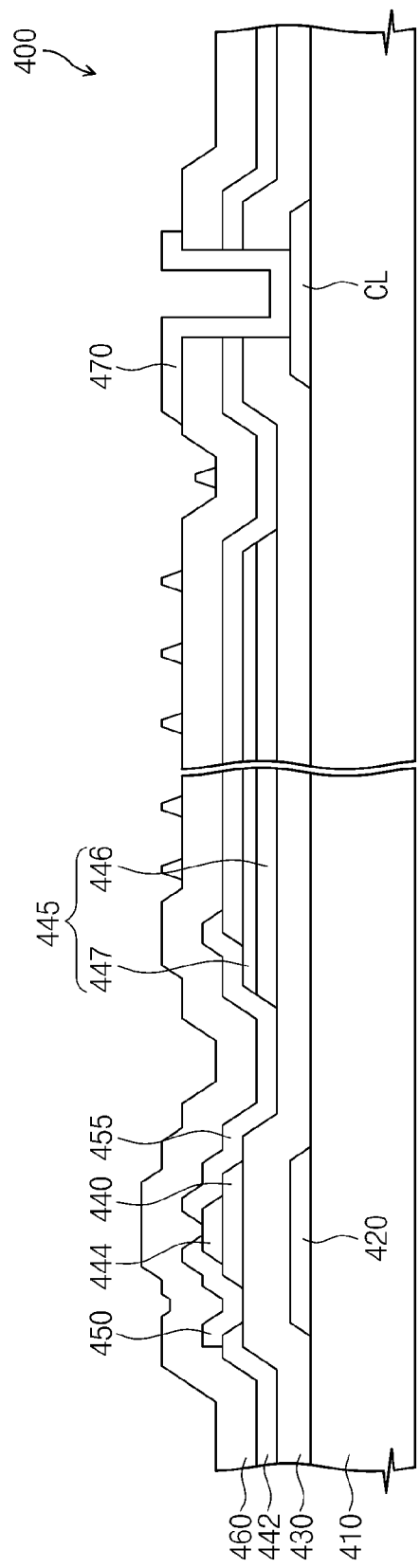
FIG. 21 is a cross-sectional view taken along line I-I' shown in FIG. 20.

FIG. 20 is a plan view showing yet another exemplary embodiment of a thin film transistor substrate 400 according to the invention and FIG. 21 is a cross-sectional view taken along line I-I' shown in FIG. 20.

Referring to FIGS. 20 and 21, one pixel PXL of the thin film transistor substrate 400 includes a thin film transistor TFT, a pixel electrode part 445 connected to the thin film transistor TFT and a common electrode 470.

The thin film transistor TFT includes a gate electrode 420, a gate insulating layer 430, a semiconductor pattern 440, an etch stopper 444, a source electrode 450 and a drain electrode 455.

The pixel electrode part 445 includes a semiconductor layer 446 and a conductive layer 447. The semiconductor layer 446 and the semiconductor pattern 440 may be a same layer of the thin film transistor substrate 400, or the semiconductor layer 446 may be disposed in and/or on a same layer as the semiconductor pattern 440. That is, the semiconductor layer 446 is disposed on the gate insulating layer 430, and the semiconductor layer 446 is spaced apart from the semiconductor pattern 440. The semiconductor layer 446 includes a same material as the semiconductor pattern 440. Accordingly, the semiconductor layer 446 may include the same oxide semiconductor, e.g., amorphous indium-gallium-zinc-oxide ("a-IGZO"), as the semiconductor pattern 440.

The conductive layer 447 is disposed on the semiconductor layer 446 to correspond to the semiconductor layer 446, for example, having substantially the same planar profile and/or location as the semiconductor layer 446. The conductive layer 447 is electrically connected to the drain electrode 455. The conductive layer 447 includes a transparent conductive material, such as gallium-zinc-oxide ("GZO") or zinc oxide (ZnO). The conductive layer 447 may serve as a pixel electrode that receives a data voltage from the drain electrode 455.

The thin film transistor substrate 400 further includes a first insulating layer 442 on the semiconductor pattern 440. The first insulating layer 442 includes an insulating material, such as silicon oxide, silicon nitride, etc. The first insulating layer 442 includes a plurality of openings extended through a thickness thereof to expose a portion of an upper surface of the semiconductor pattern 440 and a portion of an upper surface of the conductive layer 447.

At least a portion of the first insulating layer 442 makes contact with the portion of the upper surface of the semiconductor pattern 440. The portion of the first insulating layer 442, which makes contact with the portion of the upper surface of the semiconductor pattern 440, is defined as the etch stopper 444. The etch stopper 444 covers a channel area (not shown) of the semiconductor pattern 440.

The thin film transistor substrate 400 further includes a second insulating layer 460 on the source electrode 450 and the drain electrode 455. The second insulating layer 460 includes an organic insulating material or an inorganic insulating material. The gate insulating layer 430, the first insulating layer 442 and the second insulating layer 460 include a contact hole CT extended through thicknesses thereof to expose a portion of an upper surface of the common electrode line CL.

The common electrode 470 is disposed on the second insulating layer 460. At least a portion of the common electrode 470 is overlapped with the pixel electrode part 445 while the second insulating layer 460 is interposed therebetween. The common electrode 470 is electrically connected to the common electrode line CL through the contact hole CT. The common electrode 470 includes a plurality of slits SL. In FIG. 20, the slits SL include upper slits SL1 and lower slits SL2 divided by an imaginary line IL crossing the pixel area PA along the first direction D1. A longitudinal axis of the upper slits SL1 are extended from a right upper portion toward a left lower portion of an upper portion of the pixel area PA, and a longitudinal axis of the lower slits SL2 are extended from a right lower portion toward a left upper portion of a lower portion of the pixel area PA, but should not be limited thereto or thereby. In addition, the slits SL are disposed in the common electrode 470 in FIG. 20, but the slits SL may be disposed in one of the pixel electrode part 445 and the common electrode 470.

An exemplary embodiment of a manufacturing method of the thin film transistor substrate 400 is similar to the exemplary embodiment of the method of manufacturing the thin film transistor substrate 300. That is, the masks used in the exemplary embodiment of the manufacturing method to manufacture the thin film transistor substrate 400 may have different shapes from those of the masks used in the exemplary embodiment of the manufacturing method to manufacture the thin film transistor substrate 300, but the number of the masks used in the exemplary embodiment of the manufacturing method to manufacture the thin film transistor substrate 400 is the same as the number of the masks used in the exemplary embodiment of the manufacturing method to manufacture the thin film transistor substrate 300, e.g., six masks. Thus, the manufacturing cost and the number of the masks of the thin film transistor substrate 400 may be reduced, thereby reducing the manufacturing cost of the thin film transistor substrate 400.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A method of manufacturing a thin film transistor substrate, comprising:
    preparing a substrate;
    forming a gate electrode and a common electrode line on the substrate;
    forming a gate insulating layer to cover the gate electrode and the common electrode line;
    forming a semiconductor pattern overlapped with the gate electrode on the gate insulating layer, and a common electrode part spaced apart from the semiconductor pattern on the gate insulating layer using a same mask;
    depositing a first insulating material on the substrate including the semiconductor pattern and the common electrode part;
    patterning the first insulating material to form a first insulating layer;
    forming a source electrode which contacts a first portion of the semiconductor pattern;
    forming a drain electrode which contacts a second portion of the semiconductor pattern, the drain electrode spaced apart from the source electrode; and
    forming a pixel electrode partially overlapped with the common electrode part.

2. The method of claim 1, wherein the gate insulating layer is formed after the gate electrode and the common electrode line are formed.

3. The method of claim 2, wherein the forming the semiconductor pattern and the common electrode part comprises:
    depositing a semiconductor thin layer on the gate insulating layer;
    depositing a conductive layer on the semiconductor layer; and
    patterning the semiconductor thin layer and the conductive layer using the same mask, wherein the same mask is a slit mask or a diffraction mask.

4. The method of claim 3, wherein the patterning the semiconductor thin layer and the conductive layer comprises:
    coating a photoresist on the semiconductor thin layer and the conductive layer;
    exposing and developing the photoresist using the same mask, to form a first photoresist pattern;
    etching the conductive layer and the semiconductor thin layer using the first photoresist pattern as a mask, to form a first pattern overlapped with the gate electrode, and a second pattern spaced apart from the first pattern;
    etching a portion of the first photoresist pattern to form a second photoresist pattern; and
    etching the conductive layer of the first pattern using the second photoresist pattern as a mask.

5. The method of claim 4, wherein the etching the conductive layer of the first pattern comprises using an etchant having a greater etch rate for the conductive layer than for the semiconductor thin layer.

6. The method of claim 4, wherein the second photoresist pattern exposes an upper surface of the first pattern and covers an upper surface of the second pattern.

7. The method of claim 6, wherein
    the semiconductor thin layer comprises amorphous indium-gallium-zinc-oxide, and
    the conductive layer comprises gallium-zinc-oxide or zinc oxide.

8. The method of claim 1, further comprising
    depositing a second insulating material on the first insulating layer, the source electrode and the drain electrode, and
    patterning the second insulating material to form a second insulating layer, after the source and drain electrodes are formed.

* * * * *